United States Patent
Takahashi et al.

(10) Patent No.: US 11,532,103 B2
(45) Date of Patent: Dec. 20, 2022

(54) INFORMATION PROCESSING APPARATUS AND INFORMATION PROCESSING METHOD

(71) Applicant: SONY GROUP CORPORATION, Tokyo (JP)

(72) Inventors: Ryohei Takahashi, Kanagawa (JP); Mitsuhiro Hirabayashi, Tokyo (JP); Mitsuru Katsumata, Tokyo (JP); Takumi Tsuru, Kanagawa (JP); Ohji Nakagami, Tokyo (JP); Satoru Kuma, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 17/296,411

(22) PCT Filed: Dec. 16, 2019

(86) PCT No.: PCT/JP2019/049089
§ 371 (c)(1),
(2) Date: May 24, 2021

(87) PCT Pub. No.: WO2020/137642
PCT Pub. Date: Jul. 2, 2020

(65) Prior Publication Data
US 2022/0036593 A1    Feb. 3, 2022

(30) Foreign Application Priority Data
Dec. 28, 2018  (JP) .............................. JP2018-248322

(51) Int. Cl.
*G06T 9/00*  (2006.01)
(52) U.S. Cl.
CPC ...................................... *G06T 9/00* (2013.01)

(58) Field of Classification Search
CPC ........................ G06T 9/00; H04N 21/234327
See application file for complete search history.

(56) References Cited

U.S. PATENT DOCUMENTS

| 2017/0347122 A1 | 11/2017 | Chou |
| 2018/0286107 A1 | 10/2018 | Hemmer |

(Continued)

FOREIGN PATENT DOCUMENTS

| WO | WO-2017205794 A1 | 11/2017 |
| WO | WO 2017/217191 A1 | 12/2017 |
| WO | WO-2018115572 A2 | 6/2018 |

OTHER PUBLICATIONS

Third Working Draft for G-PCC (Geometry-based PCC), International Organization for Standardization, ISO/IEC JTC1/SC29/WG11, MPEG 2018/N17770, Jul. 2018, pp. i-43, Ljubljana, SI.

(Continued)

*Primary Examiner* — Jerry T Jean Baptiste
(74) *Attorney, Agent, or Firm* — Paratus Law Group, PLLC

(57) ABSTRACT

The present disclosure relates to an information processing apparatus and an information processing method that are capable of distributing higher-quality G-PCC streams. When G-PCC streams obtained by encoding Point Cloud data according to G-PCC are generated, there are generated spatial positional information indicating spatial positions of respective pieces of partial Point Cloud data that represent individual parts into which the Point Cloud data is segmented, and grouping information that groups the partial Point Cloud data. The present technology is applicable to a generating apparatus that generates G-PCC streams, for example.

10 Claims, 44 Drawing Sheets

(56) References Cited

U.S. PATENT DOCUMENTS

| | | | | |
|---|---|---|---|---|
| 2019/0236373 A1* | 8/2019 | Hu | ............... | G08B 7/066 |
| 2020/0111236 A1* | 4/2020 | Tourapis | ............... | G06T 9/001 |
| 2020/0153885 A1* | 5/2020 | Lee | ............... | H04L 65/601 |
| 2021/0304354 A1* | 9/2021 | Chang | ............... | H04N 19/597 |

OTHER PUBLICATIONS

Yiting Shao et al., Description of Core Experiment 13.2 for G-PCC: Tile and Slice based Coding of Point Cloud, International Organisation for Standardisation, ISO/IEC JTC1/SC29/WG11, N18001, Oct. 2018, pp. 1-4, Macau, China.

Takayuki Nakachi, A Media Transport Technology MMT in the Post-Ultra High Definition Age, IEICE ESS Fundamentals Review, Apr. 2018, pp. 288-301, vol. 11, No. 4.

G-PCC codec description v2, International Organisation for Standardisation, ISO/IEC JTC1/SC29/WG11, N18189, Jan. 2019, pp. 1-40, Marrakech, MA.

* cited by examiner

FIG. 4

```
<AdaptationSet id="1">
  <SupplementalProperty schemeIdUri="urn:mpeg:mepgI:gpcc:high_lod_direction:2018>
    <gpcc:directionInfo direction="0"/>
  </SupplementalProperty>
  <Representation id="1-2">...</Representation>
</AdaptationSet>
<AdaptationSet id="2">
  <SupplementalProperty schemeIdUri="urn:mpeg:mepgI:gpcc:high_lod_direction:2018>
    <gpcc:directionInfo direction="1"/>
  </SupplementalProperty>
  <Representation id="2-1">...</Representation>
</AdaptationSet>
```

FIG. 5

```
<AdaptationSet id="1">
 <Representation id="1-1">
  <SupplementalProperty schemeIdUri="urn:mpeg:mepgI:gpcc:high_lod_direction:2018>
   <gpcc:directionInfo direction="0" lod_ranking="1"/>
  </SupplementalProperty>
 </Representation>
 ...
 <Representation>...</Representation>
</AdaptationSet>
<AdaptationSet id="2">
 <Representation id="2-1">
  <SupplementalProperty schemeIdUri="urn:mpeg:mepgI:gpcc:high_lod_direction:2018>
   <gpcc:directionInfo direction="1" lod_ranking="1"/>
  </SupplementalProperty>
 </Representation>
 ...
 <Representation>...</Representation>
</AdaptationSet>
```

FIG. 7

```
aligned(8) class DirectionInformationBox extends FullBox('diri', 0, 0)
{
    unsigned int(8) high_lod_direction;
    unsigned int(8) lod_ranking;
}
```

FIG.11

```
<AdaptationSet id="1">
  <SupplementalProperty schemeIdUri="urn:mpeg:mpegI:gpcc:block_information:2018">
    <gpcc:blockInfo block_offset_x="0" block_offset_y="0"
      block_offset_z="0" block_size_x="0.5" block_size_y="1"
      block_size_z="1" object_id="1"/>
  </SupplementalProperty>
  <Representation id="1-1">...</Representation>
</AdaptationSet>
<AdaptationSet id="2">
  <SupplementalProperty schemeIdUri="urn:mpeg:mpegI:gpcc:block_information:2018">
    <gpcc:blockInfo block_offset_x="0.5" block_offset_y="0"
      block_offset_z="0" block_size_x="0.5" block_size_y="1"
      block_size_z="1" object_id="1"/>
  </SupplementalProperty>
  <Representation id="2-1">...</Representation>
</AdaptationSet>
```

FIG.13

```
<AdaptationSet id="1">
   <SupplementalProperty schemeIdUri="urn:mpeg:mpegI:gpcc:block_information:2018">
      <gpcc:blockInfo block_offset_x="0" block_offset_y="0"
         block_offset_z="0" block_size_x="0.5" block_size_y="1"
         block_size_z="1" object_id="1"/>
   </SupplementalProperty>
   <Representation id="1-1">
      <SupplementalProperty schemeIdUri="urn:mpeg:mpegI:gpcc:lod_information:2018">
         <gpcc:lodInfo lod_ranking="1"/>
      </SupplementalProperty>
      ...
   </Representation>
   <Representation id="1-2">
      <SupplementalProperty schemeIdUri="urn:mpeg:mpegI:gpcc:lod_information:2018">
         <gpcc:lodInfo lod_ranking="2"/>
      </SupplementalProperty>
      ...
   </Representation>
</AdaptationSet>
<AdaptationSet id="2">
   <SupplementalProperty schemeIdUri="urn:mpeg:mpegI:gpcc:block_information:2018">
      <gpcc:blockInfo block_offset_x="0.5" block_offset_y="0"
         block_offset_z="0" block_size_x="0.5" block_size_y="1"
         block_size_z="1" object_id="1"/>
   </SupplementalProperty>
   <Representation id="2-1">
      <SupplementalProperty schemeIdUri="urn:mpeg:mpegI:gpcc:lod_information:2018">
         <gpcc:lodInfo lod_ranking="1"/>
      </SupplementalProperty>
      ...
   </Representation>
   ...
</AdaptationSet>
```

FIG. 19

```
<AdaptationSet id="1">
  <SupplementalProperty schemeIdUri="urn:mpeg:mpegI:gpcc:block_information:2018">
    <gpcc:blockInfo block_offset_x="0" block_offset_y="0"
      block_offset_z="0" block_size_x="0.5" block_size_y="1"
      block_size_z="1" object_id="1"/>
    <gpcc:directionInfo direction="0 1 2 3 4 5">
  </SupplementalProperty>
  <Representation id="1-1">...</Representation>
</AdaptationSet>
<AdaptationSet id="2">
  <SupplementalProperty schemeIdUri="urn:mpeg:mpegI:gpcc:block_information:2018">
    <gpcc:blockInfo block_offset_x="0.5" block_offset_y="0"
      block_offset_z="0" block_size_x="0.5" block_size_y="1"
      block_size_z="1" object_id="1"/>
    <gpcc:directionInfo direction="0 1 3 4 5">
  </SupplementalProperty>
  <Representation id="2-1">...</Representation>
</AdaptationSet>
```

FIG. 21

```
<AdaptationSet id="1">
  <SupplementalProperty schemeIdUri="urn:mpeg:mpegI:gpcc:dynamic_block_information:2018">
    <gpcc:dynamicBlockInfo block_info_id="3-1" object_id="1"/>
  </SupplementalProperty>
  <Representation id="1-1">...</Representation>
</AdaptationSet>
<AdaptationSet id="2">
  ...
</AdaptationSet>
<AdaptationSet id="3">
  <Representation id="3-1" assciationId="1-1" associationType="dbif"> // timed metadata representation
  ...
  </Representation>
</AdaptationSet>
```

FIG. 22

```
class BlockInformationSampleEntry() extends MetaDataSampleEntry('dbif') {
}
```

FIG.23

```
aligned(8) BlockInformationSample() {
    unsigned int(8) num_directions;
    for(i=0; i<num_directions; i++) {
        unsigned int(8) direction;
    }
}
```

FIG.24

```
aligned(8) BlockInformationSample() {
    unsigned int(32) block_offset_x;
    unsigned int(32) block_offset_y;
    unsigned int(32) block_offset_z;
    unsigned int(32) block_size_x;
    unsigned int(32) block_size_y;
    unsigned int(32) block_size_z;
}
```

FIG. 26

```
aligned(8) class BlockGroupBox extends TrackGroupTypeBox ('blgp', 0, 0) {
// track_group_id is inherited from TrackGroupTypeBox
    unsigned int(32) block_offset_x;
    unsigned int(32) block_offset_y;
    unsigned int(32) block_offset_z;
    unsigned int(32) block_size_x;
    unsigned int(32) block_size_y;
    unsigned int(32) block_size_z;
}
```

FIG.28

```
<AdaptationSet id="1">
   <SupplementalProperty schemeIdUri="urn:mpeg:mpegI:gpcc:block_information:2018">
      <gpcc:blockInfo block_offset_x="0" block_offset_y="0"
         block_offset_z="0" block_size_x="0.5" block_size_y="1"
         block_size_z="1" object_id="1"/>
   </SupplementalProperty>
   <Representation id="1-1" associationId="2-1" associationType="pbas">
      <SupplementalProperty schemeIdUri="urn:mpeg:mpegI:gpcc:lodInfo:2018">
         <gpcc:lodInfo lod_ranking="4" />
         <gpcc:combinedAreaLodInfo combined_rep_id="2-1" lod_ranking="2"/>
      </SupplementalProperty>
   </Representation>
</AdaptationSet>
<AdaptationSet id=" 2" >
   <SupplementalProperty schemeIdUri="urn:mpeg:mpegI:gpcc:block_information:2018">
      <gpcc:blockInfo block_offset_x="0" block_offset_y="0"
         block_offset_z="0" block_size_x="1" block_size_y="1"
         block_size_z="1" object_id="1"/>
   </SupplementalProperty>
   <Representation id="2-1">
      <SupplementalProperty schemeIdUri="urn:mpeg:mpegI:gpcc:lodInfo:2018">
         <gpcc:lodInfo lod_ranking="4" />
      </SupplementalProperty>
   </Representation>
</AdaptationSet>
```

FIG. 31

```
aligned(8) class CombinedAreaLodInfoBox extends FullBox ('cloi', 0, 0) {
    unsinged int(8) num_of_entries;
    for (i=0; i<num_of_entries; i++) {
        unsinged int(32) combined_track_id;
        unsigned int(8) lod_ranking;
    }
}
```

FIG. 32

```
aligned(8) class BrickGroupEntry extends VisualSampleGroupEntry ('blif', 0, 0) {
    unsigned int(16) groupID;
    unsigned int(32) brick_offset_x;
    unsigned int(32) brick_offset_y;
    unsigned int(32) brick_offset_z;
    unsigned int(32) brick_size_x;
    unsigned int(32) brick_size_y;
    unsigned int(32) brick_size_z;
}
```

FIG. 33

```
aligned(8) class UnitMapEntry extends VisualSampleGroupEntry ('unim', 0, 0) {
    unsigned int(16) entry_count;
    for (i=0; i<entry_count; i++) {
        unsigned int(32) unit_index;
        unsigned int(16) groupID;
    }
}
```

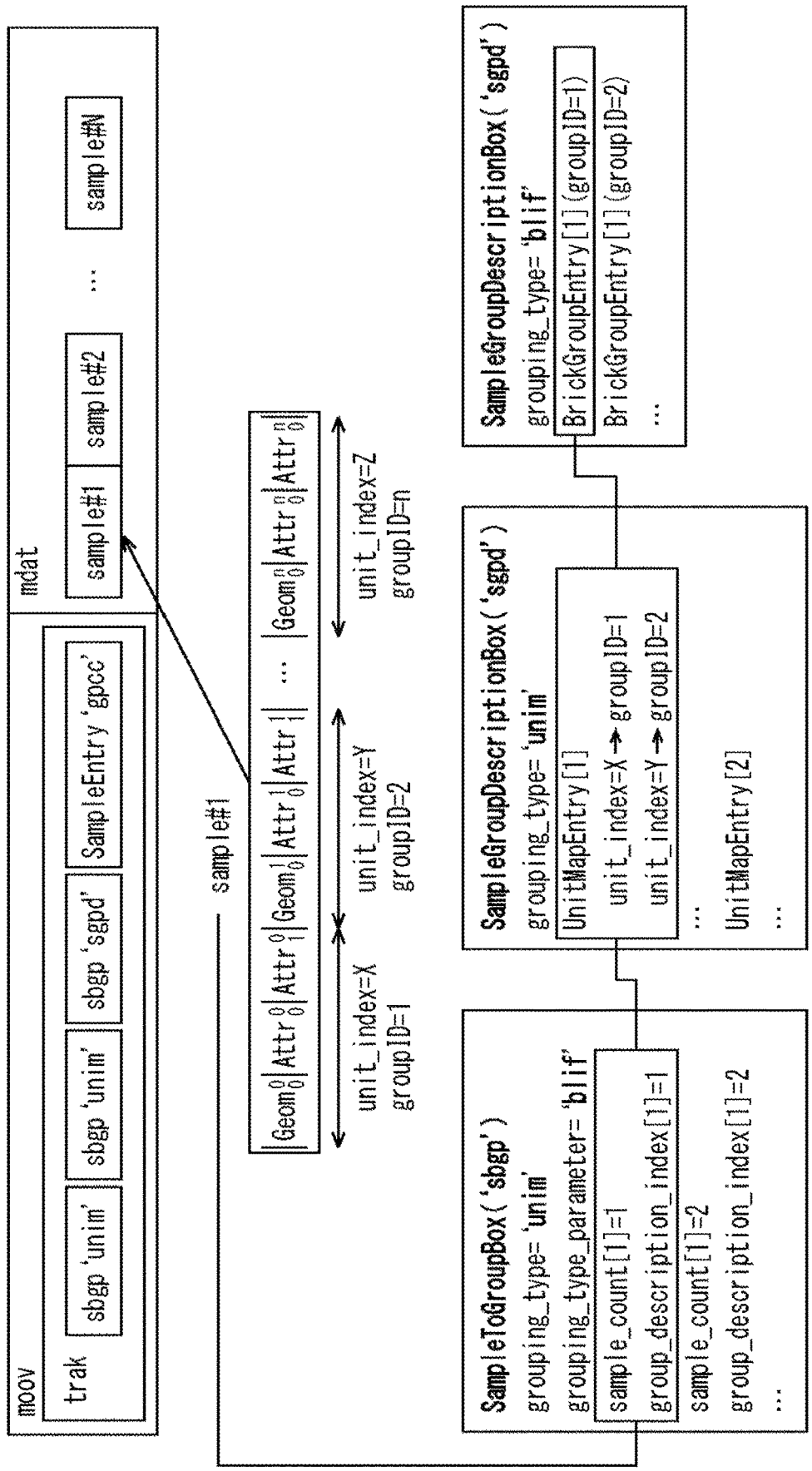
F I G. 3 4

F I G . 3 7

| | Descriptor |
|---|---|
| brick_inventory( ) { | |
| number_of_bricks | u(8) |
| for (i=0; i<number_of_bricks; i++) { | |
| brick_id | u(8) |
| brick_offset_x | u(32) |
| brick_offset_y | u(32) |
| brick_offset_z | u(32) |
| brick_size_x | u(32) |
| brick_size_y | u(32) |
| brick_size_z | u(32) |
| } | |
| } | |

FIG. 38

```
<AdaptationSet id="1">
<SupplementalProperty schemeIdUri="urn:mpeg:mpegI:gpcc:block_information:2018"/>
...
</SupplementalProperty>
<Representation id="1-1">
<SupplementalProperty schemeIdUri="urn:mpeg:mpegI:gpcc:lod_information:2018">
<gpcc:lodInfo lod_ranking="2"/>
</SupplementalProperty>
</Representation>
<Representation id="1-2">
<SupplementalProperty schemeIdUri="urn:mpeg:mpegI:gpcc:lod_information:2018">
<gpcc:lodInfo lod_ranking="4"/>
</SupplementalProperty>
</Representation>
<Representation id="1-3">
<EssentialProperty schemeIdUri="urn:mpeg:mpegI:gpcc:rendering_information:2018">
<gpcc:renderingInfo type="1"/>
</EssentialProperty>
<SupplementalProperty schemeIdUri="urn:mpeg:mpegI:gpcc:lod_information:2018">
<gpcc:lodInfo lod_ranking="6"/>
</SupplementalProperty>
</Representation>
</AdaptationSet>
```

FIG. 40

```
aligned(8) class RenderingInformationBox extends FullBox('rndi', 0, 0)
{
    unsigned int(8) type;
}
```

FIG. 41

```
<AdaptationSet id="1">
  <SupplementalProperty schemeIdUri="urn:mpeg:mpegI:gpcc:block_information:2018">
    <gpcc:blockInfo block_offset_x="0" block_offset_y="0"
     block_offset_z="0" block_size_x="0.5" block_size_y="1"
     block_size_z="1" object_id="1"/>
  </SupplementalProperty>
  <Representation id="1-1" associationId="2-2" associationType="pbas">
    <EssentialProperty schemeIdUri="urn:mpeg:mpegI:gpcc:rendering_information:2018">
      <gpcc:renderingInfo type="1" />
      <gpcc:combinedAreaRenderingInfo combined_rep_id="2-2" type="0"/>
    </EssentialProperty>
  </Representation>...</Representation>
</AdaptationSet>
<AdaptationSet id="2">
  <SupplementalProperty schemeIdUri="urn:mpeg:mpegI:gpcc:block_information:2018">
    <gpcc:blockInfo block_offset_x="0" block_offset_y="0"
     block_offset_z="0" block_size_x="1" block_size_y="1"
     block_size_z="1" object_id="1"/>
  </SupplementalProperty>
  <Representation id="2-1">...</Representation>
  <Representation id="2-2" associationId="1-1" associationType="penh">
    <EssentialProperty schemeIdUri="urn:mpeg:mpegI:gpcc:rendering_information:2018">
      <gpcc:renderingInfo type="1" />
      <gpcc:combinedAreaRenderingInfo combined_rep_id="1-1" type="0"/>
    </EssentialProperty>
  </Representation>
</AdaptationSet>
```

F I G. 4 2

```
aligned(8) class RenderingInformationBox extends FullBox('rndi', 0, 0)
{
    unsigned int(8) type;
    unsigned int(7) reserved = 0;
    unsigned int(1) combined_track_exists;
    if(combined_track_exists) {
        unsigned int(32) combined_track_id;
        unsigned int(8) combined_area_type;
    }
}
```

FIG. 43

```
aligned(8) class RenderingInformationBox extends FullBox('rndi', 0, 0)
{
    unsigned int(8) type;
    unsigned int(7) reserved = 0;
    unsigned int(1) combined_track_exists;
    if(combined_track_exists) {
        unsigned int(32) combined_track_id;
        unsigned int(8) combined_area_type;
        unsigned int(7) reserved = 0;
        unsigned int(1) priority_flag;
    }
}
```

INFORMATION PROCESSING APPARATUS AND INFORMATION PROCESSING METHOD

CROSS REFERENCE TO PRIOR APPLICATION

This application is a National Stage Patent Application of PCT International Patent Application No. PCT/JP2019/049089 (filed on Dec. 16, 2019) under 35 U.S.C. § 371, which claims priority to Japanese Patent Application No. 2018-248322 (filed on Dec. 28, 2018), which are all hereby incorporated by reference in their entirety.

TECHNICAL FIELD

The present disclosure relates to an information processing apparatus and an information processing method, and more particularly to an information processing apparatus and an information processing method that are capable of distributing higher-quality G-PCC streams.

BACKGROUND ART

Heretofore, MPEG-I Part 9 Geometry-based Point Cloud Compression (ISO/IEC 23090-9) prescribes a process of compressing a Point Cloud representing a collection of points that simultaneously have positional information and attribute information (e.g., color information, reflectance information, etc.) in a three-dimensional space.

For example, as disclosed in NPL 1, according to Geometry-based Point Cloud Compression (G-PCC), a Point Cloud is segmented into geometry representing a three-dimensional structure and attributes representing color, reflectance information, etc., and the geometry information and the attributes are encoded.

Further, octree encoding as illustrated in FIG. 1 is used for compressing geometry. For example, the octree encoding represents a process of representing, using an octree, whether or not there are points in each block with respect to data represented by Voxels. According to this process, as illustrated in FIG. 1, a block where a point exists is represented by 1 and a block where no point exists is represented by 0.

Moreover, Predicting Weight Lifting, Region Adaptive Hierarchical Transform (RAHT), or Fix Weight Lifting is used to compress attributes.

CITATION LIST

Non Patent Literature

[NPL 1]
w17770, Third Working Draft for G-PCC (Geometry-based PCC), July 2018, Ljubljana, Slovenia
[NPL 2]
w18001, Description of Core Experiment 13.2 for G-PCC: Tile and Slice based Coding of Point Cloud, October 2018, Macau, China

SUMMARY

Technical Problems

Incidentally, according to the conventional distribution technology, a G-PCC stream generated when the three-dimensional structure information of a Point Cloud object is uniformly compressed by the octree encoding as illustrated in FIG. 1 is distributed. In the case in which the three-dimensional structure information is uniformly compressed by the octree encoding, the distributed G-PCC stream has three-dimensional information that can be viewed peripherally through 360° and provides an identical level of fineness throughout the entire periphery. At this time, the limitation posed by the network bandwidth for distribution raises two points of concern to be described below.

First, when a high-definition G-PCC stream where points of a Point Cloud are dense is to be distributed, the compression ratio of the whole Point Cloud object is uniformly lowered (i.e., resulting in high definition) regardless of whether or not the G-PCC stream represents a part of the Point Cloud that the user can view at a certain time. Therefore, the bit rate is liable to increase unnecessarily, possibly resulting in reproduction interruptions.

Secondly, in a case in which the bit rate is reduced to restrain reproduction interruptions, the compression ratio of the whole G-PCC stream is uniformly increased (i.e., resulting in lower definition). Consequently, points of the Point Cloud in a part of the Point Cloud object that the user is viewing at a certain time are made sparse, resulting in low definition.

As described above, heretofore, the network bandwidth has not been utilized for better efficiency, and high-quality G-PCC stream distributions have not been realized for high-definition viewing experience and uninterrupted reproduction.

The present disclosure has been presented in view of the above situation, and is aimed at providing G-PCC stream distributions of higher quality.

Solution to Problems

An information processing apparatus according to a first aspect of the present disclosure includes a file generating section that generates a file including spatial positional information indicating spatial positions of respective pieces of partial Point Cloud data that represent individual parts into which Point Cloud data is segmented when the Point Cloud data is encoded on a three-dimensional structure base to generate encoded Point Cloud data streams, and grouping information that groups the partial Point Cloud data.

An information processing method according to the first aspect of the present disclosure includes, by an information processing apparatus, generating a file including spatial positional information indicating spatial positions of respective pieces of partial Point Cloud data that represent individual parts into which Point Cloud data is segmented when the information processing apparatus encodes the Point Cloud data on a three-dimensional structure base to generate encoded data streams, and grouping information that groups the partial Point Cloud data.

According to the first aspect of the present disclosure, when Point Cloud data is encoded on a three-dimensional structure base to generate encoded data streams, there is generated a file including spatial positional information indicating spatial positions of respective pieces of partial Point Cloud data that represent individual parts into which the Point Cloud data is segmented, and grouping information that groups the partial Point Cloud data.

An information processing apparatus according to a second aspect of the present disclosure includes an encoding section that generates partial definition degree information representing definition degrees of encoded parts when Point Cloud data is encoded on a three-dimensional structure base to generate encoded Point Cloud data streams. The encoding section generates directional information indicating a direction pointing to an area of a relatively high image quality in a local coordinate system of the Point Cloud data, on the basis of the partial definition degree information.

An information processing method according to the second aspect of the present disclosure includes, by an information processing apparatus, generating partial definition degree information representing definition degrees of encoded parts when the information processing apparatus encodes Point Cloud data on a three-dimensional structure base to generate encoded data streams. Directional information indicating a direction pointing to an area of a relatively high image quality is generated in a local coordinate system of the Point Cloud data, on the basis of the partial definition degree information.

According to the second aspect of the present disclosure, when Point Cloud data is encoded on a three-dimensional structure base to generate encoded data streams, there is generated partial definition degree information representing definition degrees of encoded parts. Furthermore, directional information indicating a direction pointing to an area of a relatively high image quality is generated in a local coordinate system of the Point Cloud data on the basis of the partial definition degree information.

BRIEF DESCRIPTION OF DRAWINGS

FIG. 4 is a diagram illustrating an example of signaling of directional information.

FIG. 5 is a diagram illustrating an example of signaling of definition degree information.

FIG. 7 is a diagram illustrating an example of a syntax in DirectionInformationBox.

FIG. 11 is a diagram illustrating an example of signaling of spatial positional information and grouping information of partial G-PCC streams.

FIG. 13 is a diagram illustrating an example of signaling of definition degree information of partial G-PCC streams.

FIG. 19 is a diagram illustrating an example of signaling of the direction corresponding information of partial G-PCC streams.

FIG. 21 is a diagram illustrating an example of signaling of spatial positional information and direction corresponding information that are changed dynamically.

FIG. 22 is a diagram illustrating an example of a syntax of a sample entry of timed metadata.

FIG. 23 is a diagram illustrating an example of a syntax of a sample of timed metadata.

FIG. 24 is a diagram illustrating an example of signaling of spatial positional information at respective times.

FIG. 26 is a diagram illustrating an example of a syntax for signaling the spatial positional information of a partial G-PCC stream in BlockGroupBox.

FIG. 28 is a diagram illustrating an example of signaling of the spatial positional information of G-PCC streams to be combined.

FIG. 31 is a diagram illustrating an example of a syntax of CombinedAreaLodInfoBox('cloi').

FIG. 32 is a diagram illustrating an example of a syntax of BrickGroupEntry.

FIG. 33 is a diagram illustrating an example of a syntax of UnitMapEntry.

FIG. 34 is a diagram illustrating an example in which BrickGroupEntry and UnitMapEntry are applied.

FIG. 37 is a diagram illustrating an example of signaling of the spatial positional information of brick.

FIG. 38 is a diagram illustrating an example of signaling of a rendering process.

FIG. 40 is a diagram illustrating an example of a syntax of RenderingInformationBox.

FIG. 41 is a diagram illustrating an example of a syntax of a processing type for parts that are made high in definition.

FIG. 42 is a diagram illustrating an example of a syntax where a combined_track_exists field, a combined_track_id field, and a combined_area_type field are added.

FIG. 43 is a diagram illustrating an example of a syntax where a priority_flag field is added.

DESCRIPTION OF EMBODIMENT

Figure 1:
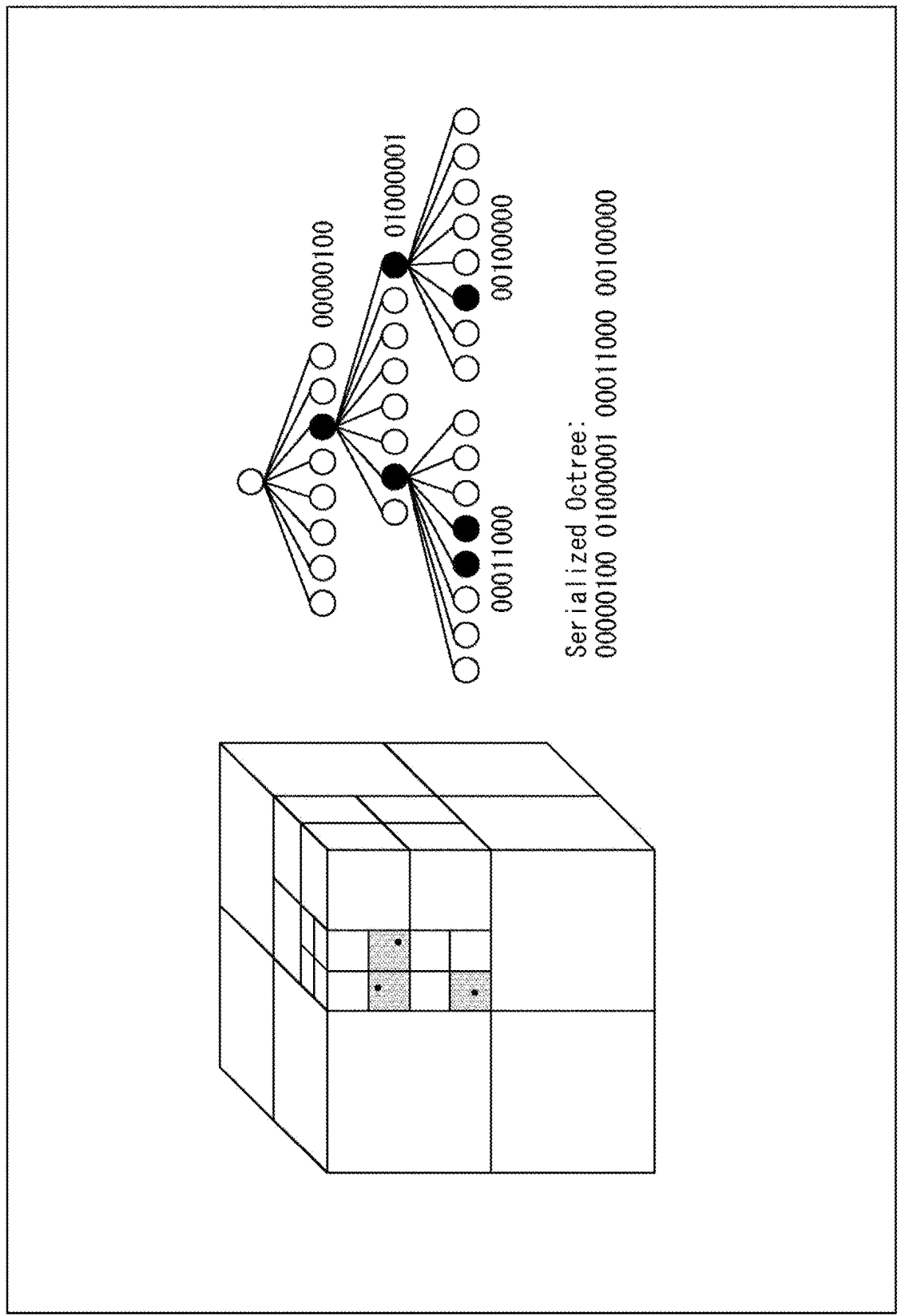
FIG. 1 is a diagram that is illustrative of octree encoding.

A specific embodiment of the present technology will hereinafter be described in detail with reference to the drawings.

<Three Points of the Present Disclosure>

First, a summary of first through third points representing features of the technology disclosed in the present embodiment will be described below. For example, in a case in which a Point Cloud object is viewed on an HMD (Head Mounted Display) or a Flat Panel Display, there is used a viewing-direction-adaptive distribution technology based on a fact that surface shapes and colors on a side opposite a viewing direction cannot be seen.

The first point resides in that G-PCC streams generated by encoding parts of one Point Cloud object at different definition degrees for the respective parts are distributed. For example, directional information representing a direction that points to high definition and definition degree information representing a definition degree in that direction are added to G-PCC streams. With the added information, a client is able to acquire G-PCC streams where viewed parts are of high definition and parts other than the viewed parts are of low definition. Therefore, the first point makes it possible to realize viewed parts of high definition by effectively utilizing a network bandwidth.

The second point resides in that one Point Cloud object is segmented into a plurality of partial objects and partial G-PCC streams generated by encoding the individual partial objects at different definition degrees are distributed. Furthermore, the second point proposes a first process of distributing partial G-PCC streams generated by spatial segmentation and a second process of distributing partial G-PCC streams generated by hierarchization.

For example, according to the first process of the second point, spatial positional information and definition degree information are added to each partial G-PCC stream. With the added information, the client is able to acquire high-definition partial G-PCC streams for viewed parts and low-definition partial G-PCC streams for parts other than the viewed parts. Therefore, the first process of the second point makes it possible to realize viewed parts of high definition by effectively utilizing the network bandwidth.

Moreover, according to the second process of the second point, information for identifying partial G-PCC streams to be combined for high definition is added to the information added to each partial G-PCC stream by the first process of the second point. With the added information, the client is able to acquire partial G-PCC streams in a combination required to make viewed parts high in definition. Therefore, the second process of the second point also makes it possible to realize viewed parts of high definition by effectively utilizing the network bandwidth.

According to the third point, a rendering process is specified for low-definition parts of a Point Cloud object. For example, information of a rendering process required to increase subjective quality of low-definition parts is added to G-PCC streams. With the information, the client is able to identify the specified rendering process and, in a case in which the process is executable, to acquire the G-PCC streams to which the information of the rendering process has been added. Consequently, the third point makes it possible to maintain the subjective quality and to also reduce the network bandwidth required for G-PCC stream distributions.

Incidentally, the information added according to the first through third points is signaled by extending DASH MPD (Dynamic Adaptive Streaming over HTTP Media Presentation Description) or ISOBMFF (ISO Base Media File Format).

<First Point>

The first point for distributing G-PCC streams generated by encoding parts at different definition degrees will be described below with reference to FIGS. 2 through 7.

Figure 2:
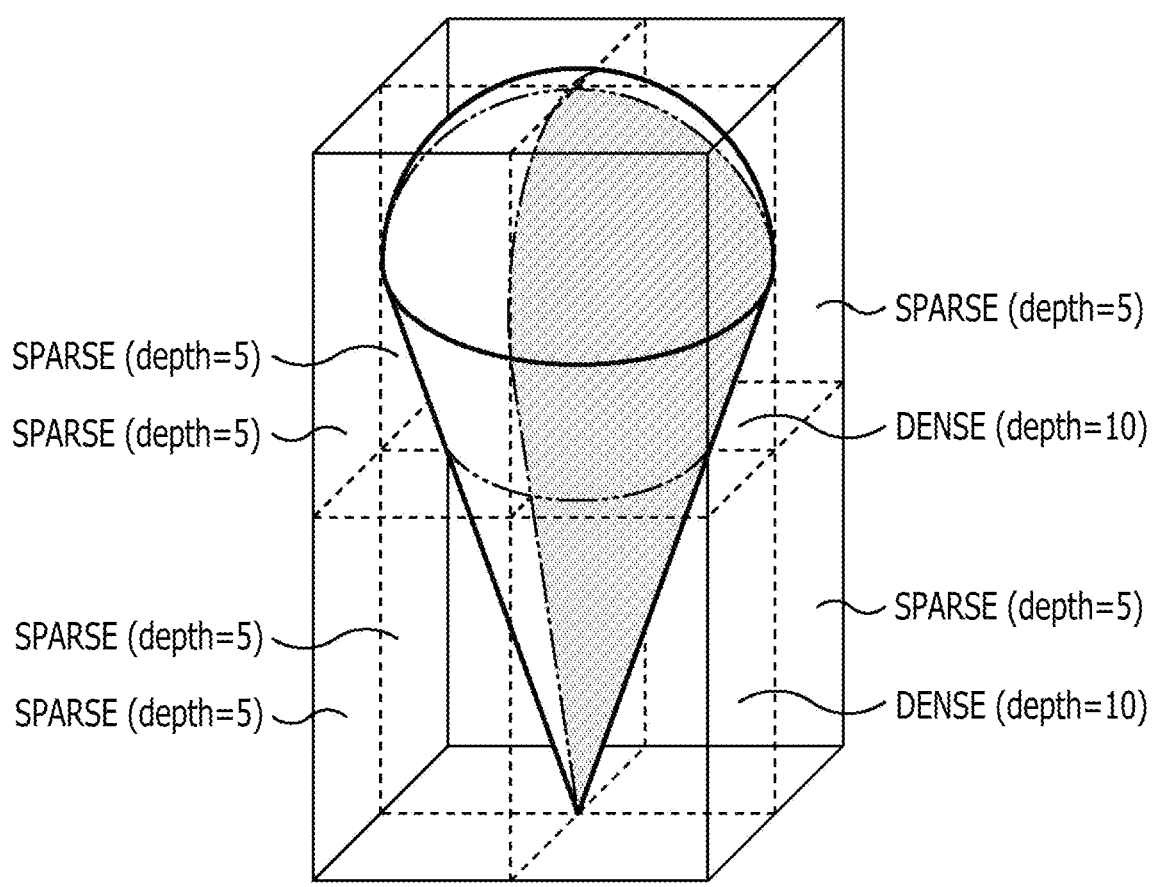
FIG. 2 is a diagram illustrating an example in which a Point Cloud object is encoded at different definition degrees for respective parts thereof.

As illustrated in FIG. 2, when G-PCC streams are to be generated, it is possible to encode parts of a Point Cloud object at different definition degrees by changing fineness (octree depth) with which Voxels are demarcated in each of the parts.

In the example illustrated in FIG. 2, a Point Cloud object is segmented into eight parts. Two out of the parts that are indicated hatched in grey are encoded in high definition (depth=10), and the remaining parts are encoded in low definition (depth=5).

With the parts thus encoded, the client is able to acquire encoded high-definition G-PCC streams for viewed parts and encoded low-definition G-PCC streams for the other parts. It is thus possible to realize viewed parts of high definition by effectively utilizing the network bandwidth. At this time, since the definition degree of each part cannot be identified unless the G-PCC stream is decoded, when the client selects and acquires G-PCC streams on a server, it is necessary for the client to be able to identify G-PCC streams for high-definition viewed parts.

For example, such an identification capability is required in selecting streams of high image quality for regions of a 360 entire-celestial-sphere image depending on a viewing direction. Specifically, in the case of streams of high image quality for regions of a 360 entire-celestial-sphere image, since a position of a viewpoint is fixed, parts that are viewed by a user depends only on the viewing direction. Consequently, it is general practice to add information corresponding to the viewing direction of the regions of high image quality to the streams of high image quality for the regions of the 360 entire-celestial-sphere image.

On the other hand, in the case of G-PCC streams according to the present technology, one part of a Point Cloud object can be viewed in different viewing directions from various viewpoint positions. Therefore, even though the client refers to information corresponding to the viewing direction as used on a 360 entire-celestial-sphere image, the client is unable to appropriately acquire G-PCC streams for high-definition viewed parts.

In this respect, according to the first point, it is proposed to signal a direction pointing to high definition with regard to G-PCC streams. With this proposal, it is possible for the client to select and acquire G-PCC streams for high-definition viewed parts depending on the viewing direction and the viewpoint position.

According to the first point, further, it is proposed to signal the definition degree information for a direction pointing to high definition of G-PCC streams. With this proposal, in a case in which the viewed part of a G-PCC stream has changed, it is possible for the G-PCC stream to switch to a G-PCC stream where the definition degree of a new viewed part is equivalent to the definition degree of the previous viewed part that has changed. For example, in a case in which the definition degree changes largely due to a change of the viewed part, it is expected that the user's viewing experience might be impaired. However, the user's viewing experience can be prevented from being impaired by suppressing the definition degree from changing despite the change of the viewed part.

Extension of DASH MPD will be described below with reference to FIGS. 3 through 5.

For example, as the information of a direction pointing to high definition of G-PCC streams, a high lod direction descriptor (SupplementalProperty of schemeIdUri="urn:

mpeg:mepgI:gpcc:high_lod_direction:2018") is newly defined and signaled in AdaptationSet. In other words, the information of a direction pointing to high definition is signaled in a direction attribute of a gpcc:directionInfo element.

Figure 3:
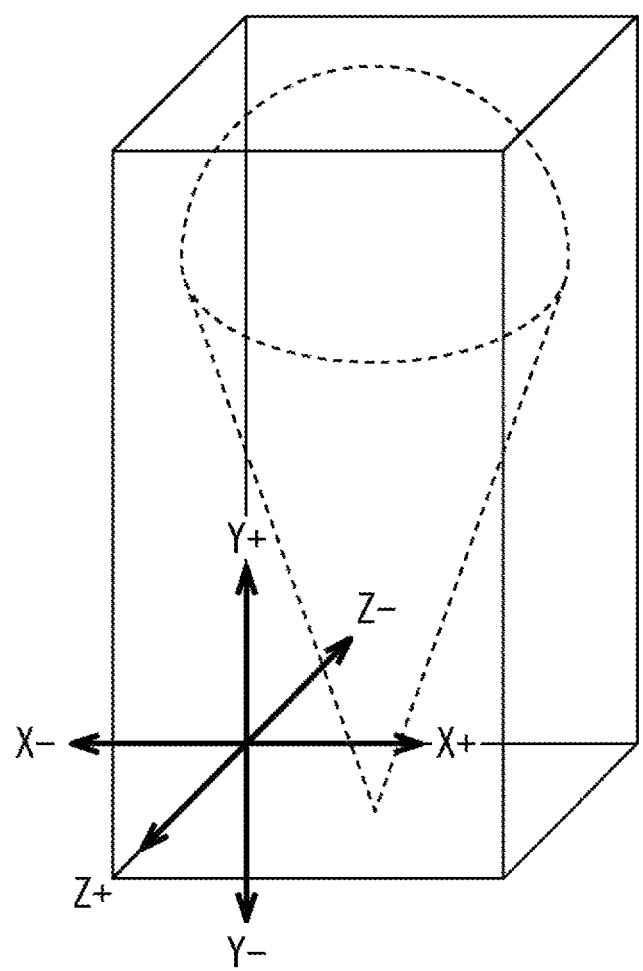
FIG. 3 is a diagram illustrating an example of directions indicated by directional information.

Further, as illustrated in FIG. 3, values that can be taken by the direction attribute can be signaled in six directions of 0: X+, 1: Y+, 2: X−, 3: Y−, 4: Z+, and 5: Z− on the basis of a local coordinate system of the Point Cloud. In addition, directions may be signaled at smaller granularities such as 45° intervals.

Incidentally, a plurality of directions may be rendered high in definition in one G-PCC stream. In this case, the directions may be signaled using a plurality of gpcc:directionInfo elements. Moreover, "gpcc:" is a name space prefix and shall use a name space of "urn:mpeg:mpegI:gpcc:2018," for example.

FIG. 4 illustrates an example of signaling of directional information. Directional information is signaled at locations indicated by bold letters in FIG. 4.

For example, in a case in which the user is viewing a part of a Point Cloud in the X+ direction of the local coordinate system, the client can refer to the high lod direction descriptor and select AdaptationSet@id=1 to acquire a high-definition part. This makes it possible to display the Point Cloud that makes the user's viewed part high in definition.

Furthermore, the definition degree information that represents the definition degree in a direction pointing to high definition is added to the high lod direction descriptor and signaled in Representation. For example, definition degree ranking information is signaled in a lod_ranking attribute of the gpcc:directionInfo element. The definition degree ranking indicates that the smaller its value is, the higher the definition degree is.

FIG. 5 illustrates an example of signaling of definition degree information. Definition degree information is signaled at locations indicated by bold letters in FIG. 5.

For example, in a case in which the user is viewing a part of a Point Cloud in the X+ direction of the local coordinate system, and the client is reproducing Representation@id="1-1," it is assumed that the viewpoint position and the viewing direction have changed for the user to view a part in the Y+ direction. At this time, the client can select Representation@id="2-1" of AdaptationSet@id="2" and acquire a part of the same definition degree as that before the viewpoint position and the viewing direction has changed. Therefore, the definition degree is restrained from changing largely due to the change of the viewed part, preventing the user's viewing experience from being impaired.

Incidentally, rather than the definition degree ranking information, a value of the octree depth in the direction pointing to high definition may be signaled as the definition degree information in the direction pointing to high definition.

Expansion of ISOBMFF will be described below with reference to FIGS. 6 and 7.

For example, as the directional information representing a direction that points to high definition and the definition degree information representing a definition degree in the direction that points to high definition, DirectionInformationBox('diri') is newly defined and signaled.

Figure 6:
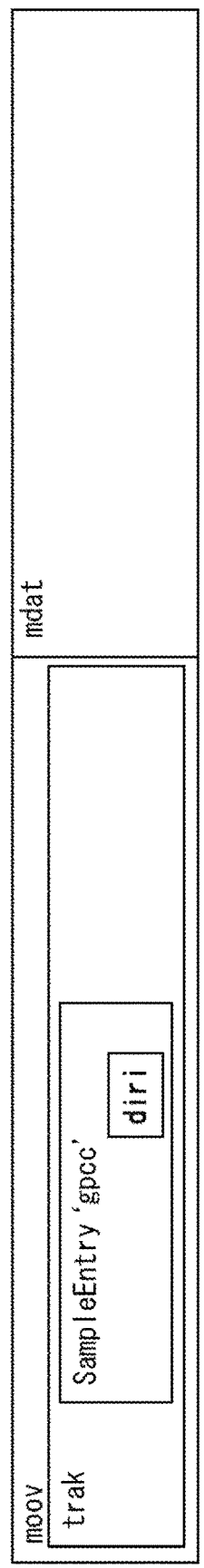
FIG. 6 is a diagram illustrating an example of a signal location in DirectionInformationBox.

Then, as illustrated in FIG. 6, the directional information and the definition degree information ('diri') of a G-PCC stream stored in an ISOBMFF track are signaled in a sample entry of the track. Therefore, the client is able to select a track for making a viewed part high in definition out of a plurality of tracks included in ISOBMFF, on the basis of the directional information and the definition degree information, and reproduce the viewed part with high definition.

FIG. 7 illustrates an example of a syntax in directionInformationBox.

In the syntax illustrated in FIG. 7, semantics of a high_lod_direction field and a lod_ranking field are similar to an attribute having the same name of the gpcc:directionInfo element of the high lod direction descriptor.

Incidentally, rather than the definition degree ranking information, the value of the octree depth in the direction pointing to high definition may be signaled as the definition degree information in the direction pointing to high definition. Moreover, the definition degree information ('diri') may be signaled in locations other than the sample entry of the ISOBMFF track.

<Second Point>

The second point for distributing partial G-PCC streams generated by encoding partial objects at different definition degrees will be described below with reference to FIGS. 8 through 37.

For example, one Point Cloud object is segmented into plural partial Point Cloud objects, and partial G-PCC streams are generated by encoding the partial Point Cloud objects. When the partial Point Cloud objects are encoded, the octree depth is changed such that the partial G-PCC streams have respective definition degree variations. With the definition degree variations, the client can acquire partial G-PCC streams such that viewed parts are of high definition and other parts are of low definition, thereby making it possible to realize viewed parts of high definition by effectively utilizing the network bandwidth.

At this time, it is necessary to identify which part of the Point Cloud object a partial G-PCC stream corresponds to, and to also identify the definition degree information of the partial G-PCC stream without decoding it. In other words, when the client selects and acquires G-PCC streams on the server, it is necessary to appropriately select partial G-PCC streams for making viewed parts high in definition.

The first process of the second point for distributing partial G-PCC streams generated by spatial segmentation will be described below with reference to FIGS. 8 through 26.

Figure 8:
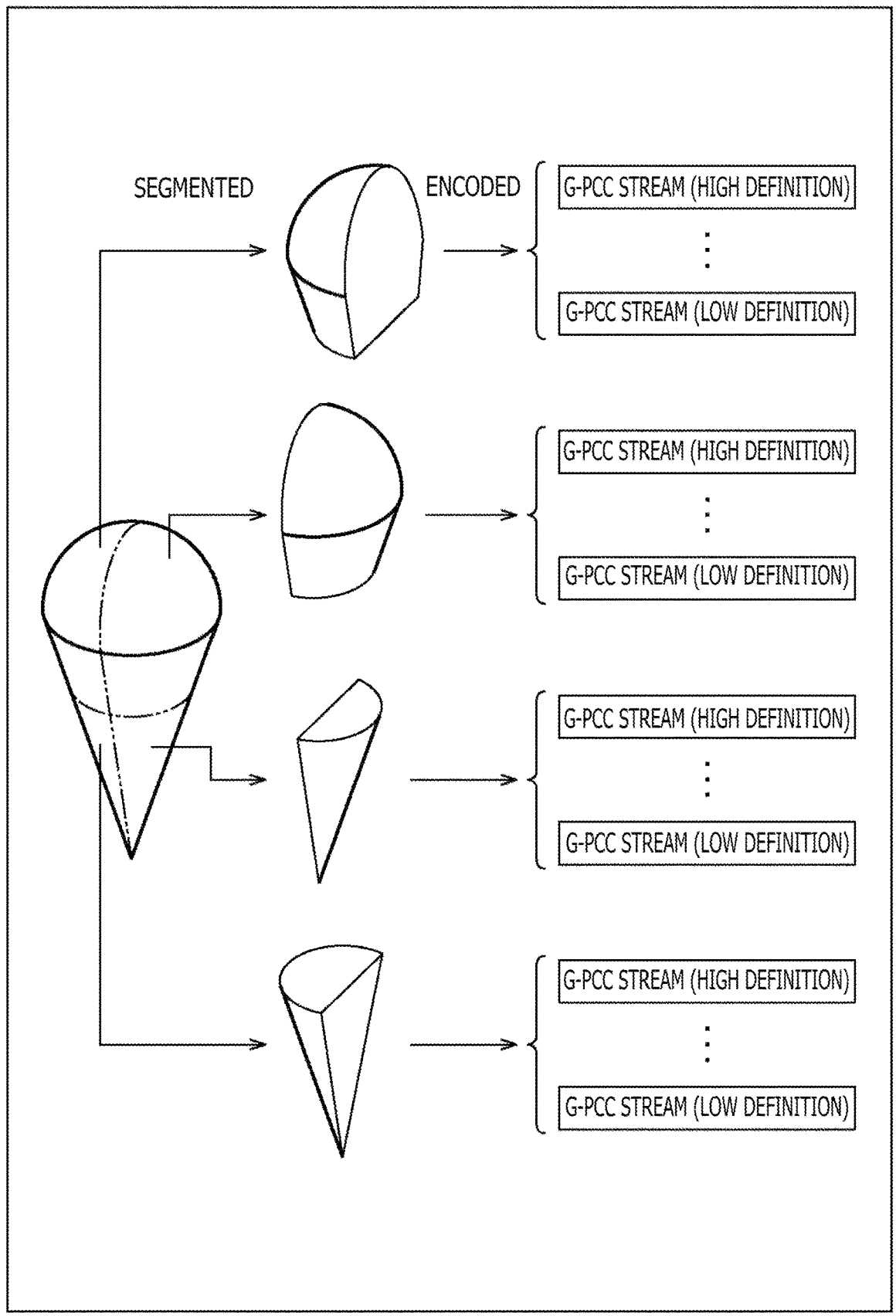
FIG. 8 is a diagram illustrating an example of a Point Cloud object segmented into four parts.

As illustrated in FIG. 8, partial Point Clouds are generated by spatially segmenting one Point Cloud object, and partial G-PCC streams can be generated and distributed by encoding the partial Point Clouds. FIG. 8 illustrates an example of a Point Cloud object spatially segmented into four parts.

At this time, the spatial positional information of the partial G-PCC streams and grouping information of the partial G-PCC streams that make up the one whole Point Cloud object are signaled. Furthermore, the definition degree information of the partial G-PCC streams is signaled.

The client is thus able to acquire partial G-PCC streams for making viewed parts high in definition by referring to the grouping information and the definition degree information of the partial G-PCC streams.

Here, a process of spatial segmentation and spatial positional information will be described below.

For example, a shape of a Point Cloud object changes frame by frame at most. Therefore, spatial segmentation is performed by applying a constant segmentation rule that does not depend on changes in the shape of a Point Cloud object. Specifically, a partial Point Cloud object included in a cuboidal block (hereinafter referred to as a block) that occupies a spatial position that is relatively identical to a box including a whole Point Cloud object (hereinafter referred to as an object box) is encoded as one partial G-PCC stream.

Figure 9:
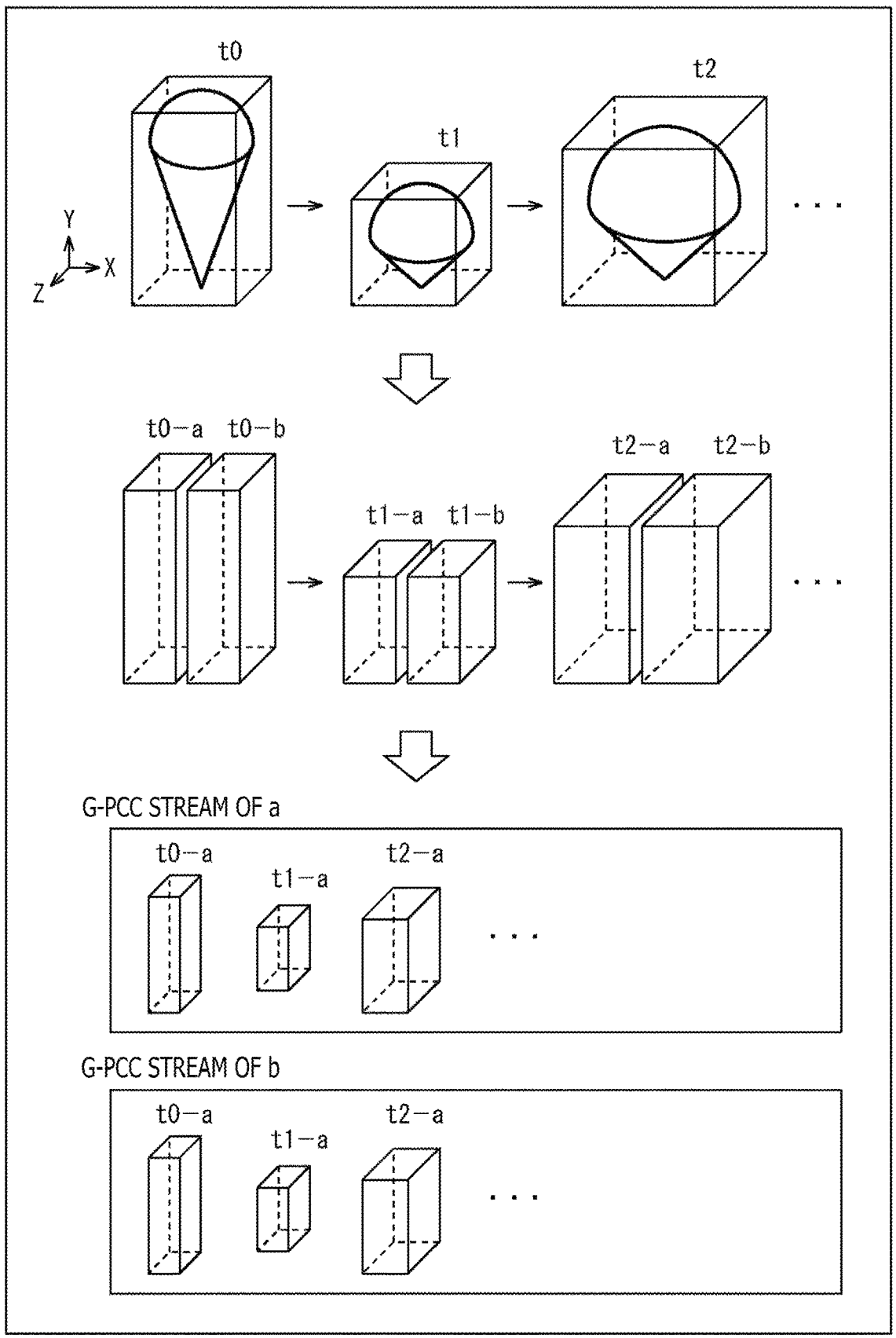
FIG. 9 is a diagram illustrating an example of object boxes segmented into halves in an X-axis direction.

FIG. 9 illustrates an example of object boxes segmented into halves in an X-axis direction.

As illustrated in FIG. 9, an object box including a whole Point Cloud object at time t0 is segmented into halves as partial Point Cloud objects t0-*a* and t0-*b* in the X-axis direction. Similarly, an object box is segmented into partial Point Cloud objects t1-*a* and t1-*b* at time t1, and an object box is segmented into partial Point Cloud objects t2-*a* and t2-*b* at time t2. G-PCC streams of a include the partial Point Cloud object t0-*a*, the partial Point Cloud object t1-*a*, and the partial Point Cloud object t2-*a*, whereas G-PCC streams of b include the partial Point Cloud object t0-*b*, the partial Point Cloud object t1-*b*, and the partial Point Cloud object t2-*b*.

According to this process, the relative spatial positions of the partial Point Cloud objects included in the partial G-PCC streams with respect to the whole Point Cloud object remain dynamically unchanged. In a case in which the relative spatial positions are dynamically changed, the relation between viewed parts and partial G-PCC streams that include the viewed parts is dynamically changed. Therefore, in a case in which the client acquires G-PCC streams for making the viewed parts high in definition, even if the viewed parts are unchanged, it is necessary to switch between high-definition G-PCC streams that are acquired. The process of spatial segmentation thus makes it unnecessary to switch between high-definition G-PCC streams that are acquired, when the viewed parts are unchanged.

Extension of DASH MPD will be described below with reference to FIGS. 10 through 13.

For example, as the spatial positional information and grouping information of partial G-PCC streams, a block information descriptor (SupplementalProperty of schemeIdUri="urn:mpeg:mepgI:gpcc:block_information:2018") is newly defined and signaled in AdaptationSet.

Figure 10:
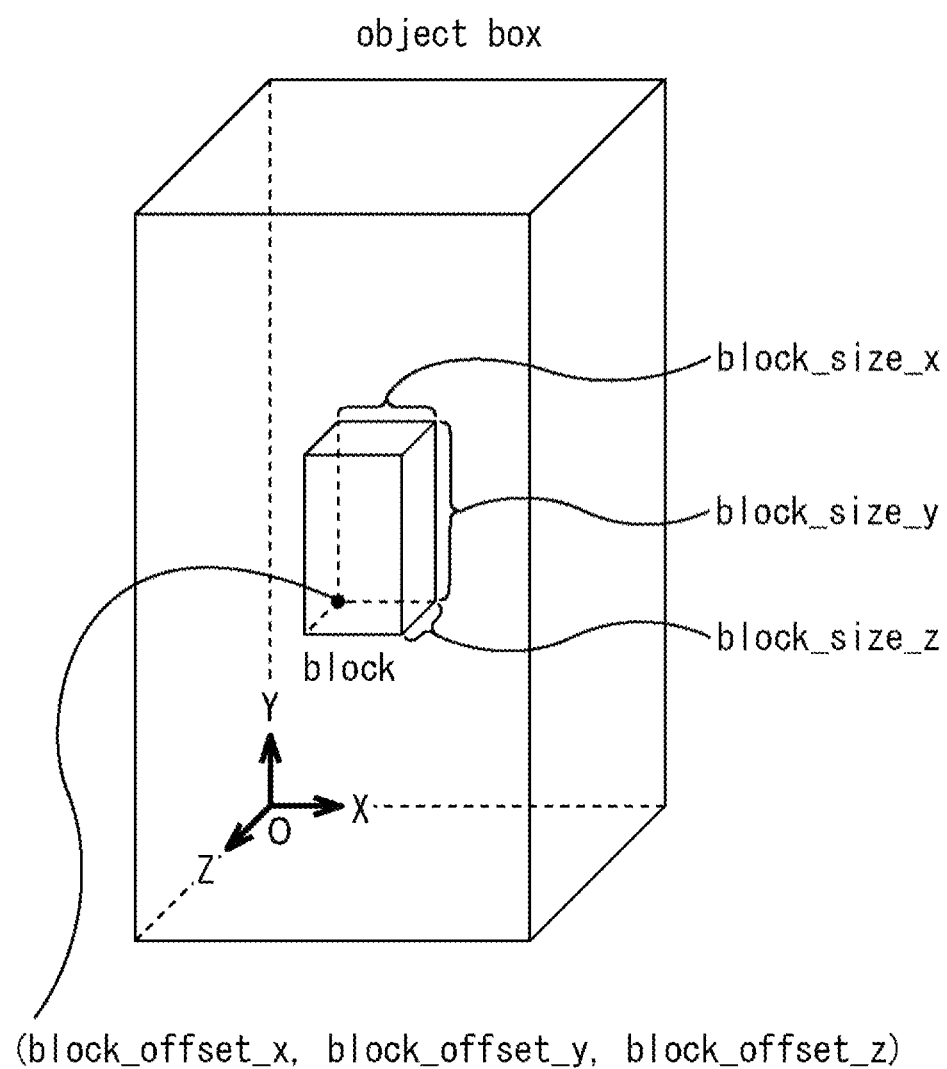
FIG. 10 is a diagram illustrating a definition of attributes of gpcc:blockInfo.

As illustrated in FIG. 10, the spatial positional information is indicated by attributes of block_offset_x, block_offset_y, block_offset_z, block_size_x, block_size_y, and block_size_z of a gpcc:blockInfo element. These attributes are signaled as relative values at the time when each of sides of the object box along x-, y-, and z-axes is represented by 1. The position and shape of the block and the position and shape of a bounding box at the time when the partial Point Cloud objects are G-PCC-encoded shall be the same as each other. In a case in which either one of the position and shape of the block is different from the position or shape of the bounding box at the time when the partial Point Cloud objects are G-PCC-encoded, it is sufficient if information representing the position and shape of the block in the bounding box is separately signaled.

Furthermore, the grouping information is indicated by an object_id attribute of the gpcc:blockInfo element. Object_id attributes of the same value are signaled for partial G-PCC streams that make up one Point Cloud object.

FIG. 11 illustrates an example of signaling of the spatial positional information and grouping information of partial G-PCC streams. The spatial positional information and grouping information of partial G-PCC streams are signaled at locations indicated by bold letters in FIG. 11.

Figure 12:
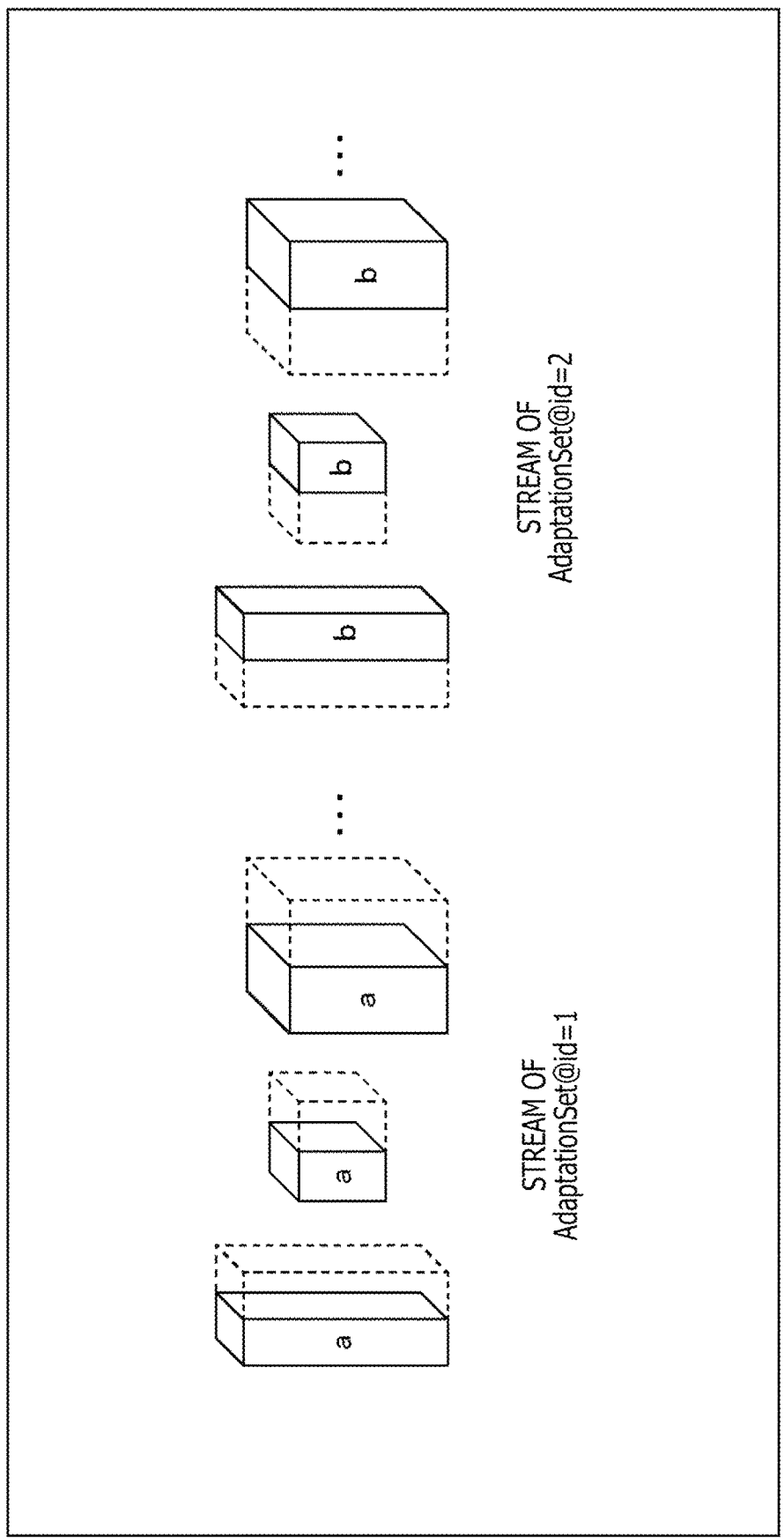
FIG. 12 is a diagram illustrating a visual representation of spatial positional information.

FIG. 12 is a diagram illustrating a visual representation of spatial positional information that is signaled by block information descriptors of respective AdaptationSets.

Incidentally, providing that an attribute for signaling definition degree information is added to a gpcc:blockInfo element and then a plurality of gpcc:blockInfo elements is signaled by a block information descriptor, it is possible to signal definition degree information at each spatial position of one G-PCC stream. For example, in the first point described above, a process of selecting G-PCC streams for high-definition viewed parts may be carried out by referring to the extended block information descriptor.

In addition, according to a modification of spatial positional information signaling, sizes of the sides of an object box along x-, y-, and z-axes may be signaled, and block_offset_x, block_offset_y, block_offset_z, block_size_x, block_size_y, and block_size_z may be signaled by relative values with respect to the sizes.

Furthermore, as the definition degree information of partial G-PCC streams, a lod direction descriptor (SupplementalProperty of schemeIdUri="urn:mpeg:mepgI:gpcc:lod_information:2018") is newly defined and signaled in Representation. For example, definition degree ranking information is signaled in the lod_ranking attribute of a gpcc:lodInfo element. The definition degree ranking indicates that the smaller its value is, the higher the definition degree is.

FIG. 13 illustrates an example of signaling of the definition degree information of partial G-PCC streams. The definition degree information of partial G-PCC streams is signaled at locations indicated by bold letters in FIG. 13.

Here, signaling of block information descriptors of respective AdaptationSets is similar to those illustrated above in FIG. 11.

Incidentally, the value of an octree depth, rather than the definition degree ranking information, may be signaled as the definition degree information.

Further, in a case in which the client is viewing from the X+ direction in the example illustrated in FIG. 13, Adaptation Set@id="2" that refers to the partial G-PCC stream of block b illustrated in FIG. 12 selects Representation of high definition (where the value of lod_ranking is small). Furthermore, in this case, AdaptationSet@id="1" that refers to the partial G-PCC stream of block a selects Representation of low definition (where the value of lod_ranking is large). Then, by acquiring partial G-PCC streams according to these selections, it is possible to realize viewed parts of high definition by effectively utilizing the network bandwidth. For example, partial G-PCC streams that two Representations including Representation@id="1-2" and Representation@id="2-1" refer to are acquired.

<System Configurations>

System configurations of a data generating device and a data reproducing device to which the present technology is applied will be described below with reference to FIGS. 14 and 15.

Figure 14:
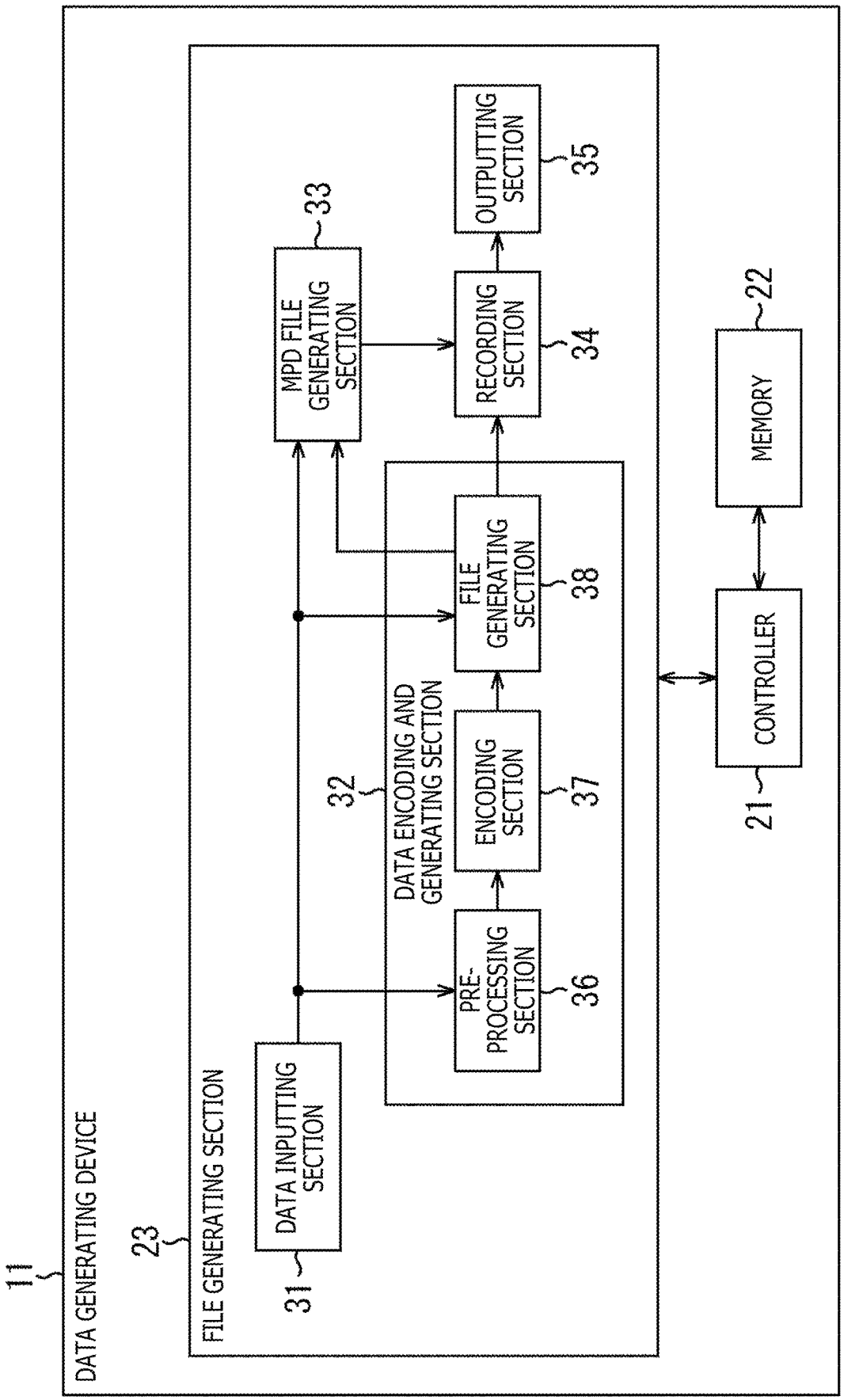
FIG. 14 is a block diagram illustrating a configurational example of a data generating device.

FIG. 14 is a block diagram illustrating a configurational example of the data generating device.

As illustrated in FIG. 14, the data generating device, denoted by 11, includes a controller 21, a memory 22, and a file generating section 23. For example, the memory 22 stores various kinds of data required for the controller 21 to control the file generating section 23, and the controller 21 refers to the data to control the file generating section 23 to generate files.

The file generating section 23 includes a data inputting section 31, a data encoding and generating section 32, an MPD (Media Presentation Description) file generating section 33, a recording section 34, and an outputting section 35. For example, data that is input to the data inputting section 31 is supplied to the data encoding and generating section 32 and the MPD file generating section 33. Files generated by the data encoding and generating section 32 and MPDs generated by the MPD file generating section 33 are output from the outputting section 35 through the recording section 34, and recorded in a recording medium, for example.

The data encoding and generating section 32 has a pre-processing section 36, an encoding section 37, and a file generating section 38.

The pre-processing section 36 performs a process of segmenting a Point Cloud object input from the data inputting section 31 to generate partial Point Cloud objects and simultaneously generating spatial positional information and grouping information.

The encoding section 37 G-PCC-encodes the partial Point Cloud objects to generate partial G-PCC streams and simultaneously generates definition degree information.

The file generating section 38 stores the partial G-PCC streams in individual files and supplies the files to the recording section 34.

Figure 15:
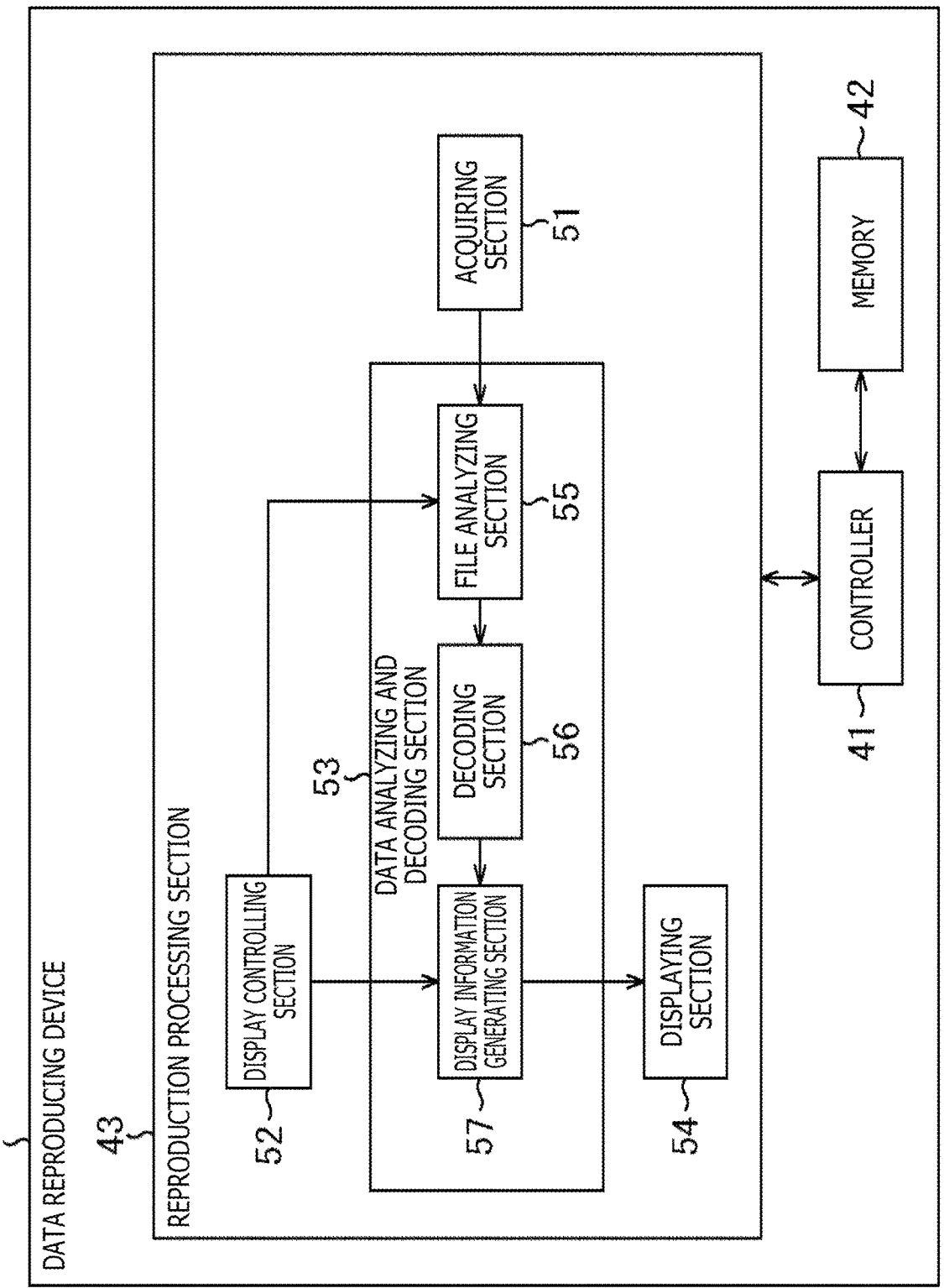
FIG. 15 is a block diagram illustrating a configurational example of a data reproducing device.

FIG. 15 is a block diagram illustrating a configurational example of the data reproducing device.

As illustrated in FIG. 15, the data reproducing device, denoted by 12, includes a controller 41, a memory 42, and a reproduction processing section 43. For example, the memory 42 stores various kinds of data required for the controller 41 to control the reproduction processing section 43, and the controller 41 refers to the data to control the reproduction processing section 43 to reproduce a Point Cloud.

The reproduction processing section 43 includes an acquiring section 51, a display controlling section 52, a data analyzing and decoding section 53, and a displaying section 54. For example, files and MPDs acquired by the acquiring section 51, i.e., read from a recording medium or the like, are supplied to the data analyzing and decoding section 53. Then, display screens generated by the data analyzing and decoding section 53 according to display control by the display controlling section 52 are displayed by the displaying section 54.

The data analyzing and decoding section 53 has a file analyzing section 55, a decoding section 56, and a display information generating section 57.

The file analyzing section 55 analyzes meta data where various kinds of information described above are signaled.

Moreover, the decoding section 56 performs a process of decoding partial G-PCC streams.

Furthermore, the display information generating section 57 reconstructs a Point Cloud object on the basis of spatial positional information, renders a Point Cloud to generate a display screen, and controls the displaying section 54 to display the display screen.

<Generating Process and Reproducing Process>

Figure 16:
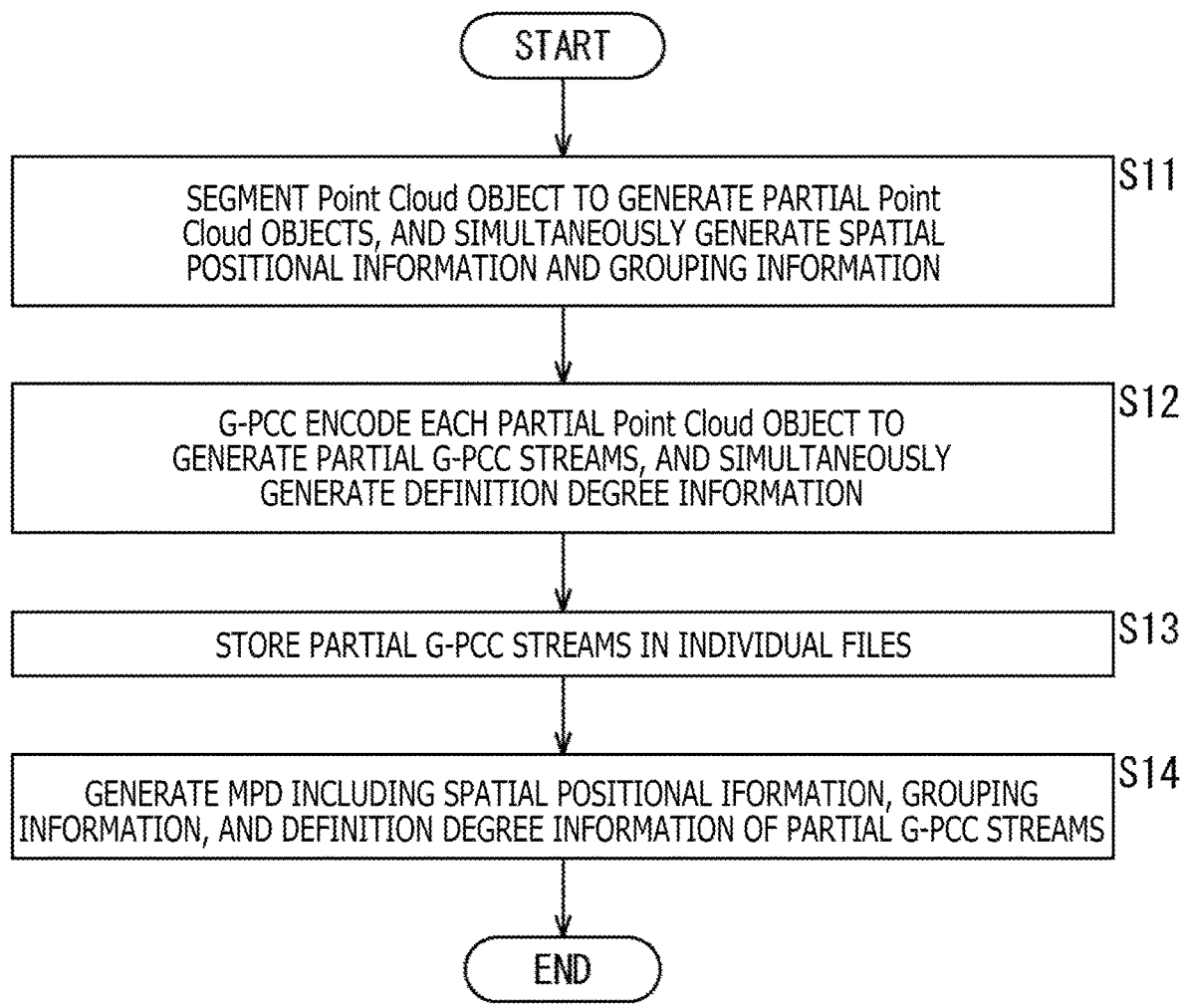
FIG. 16 is a flowchart that is illustrative of a generating process for generating files that store partial G-PCC streams.

FIG. 16 is a flowchart that is illustrative of a generating process in which the data encoding and generating section 32 of the data generating device 11 generates files that store partial G-PCC streams.

In step S11, the pre-processing section 36 segments a Point Cloud object to generate partial Point Cloud objects and simultaneously generates spatial positional information and grouping information.

In step S12, the encoding section 37 G-PCC-encodes the partial Point Cloud objects to generate partial G-PCC streams, and simultaneously generates definition degree information.

In step S13, the file generating section 38 stores the partial G-PCC streams in individual files and stores the files in the recording section 34.

In step S14, the MPD file generating section 33 generates MPDs including the spatial positional information, the grouping information, and the definition degree information of the partial G-PCC streams and supplies the generated MPDs to the recording section 34. Then, after the MPDs together with the files where the partial G-PCC streams are stored are output from the recording section 34 via the outputting section 35, the generating process is ended.

Figure 17:
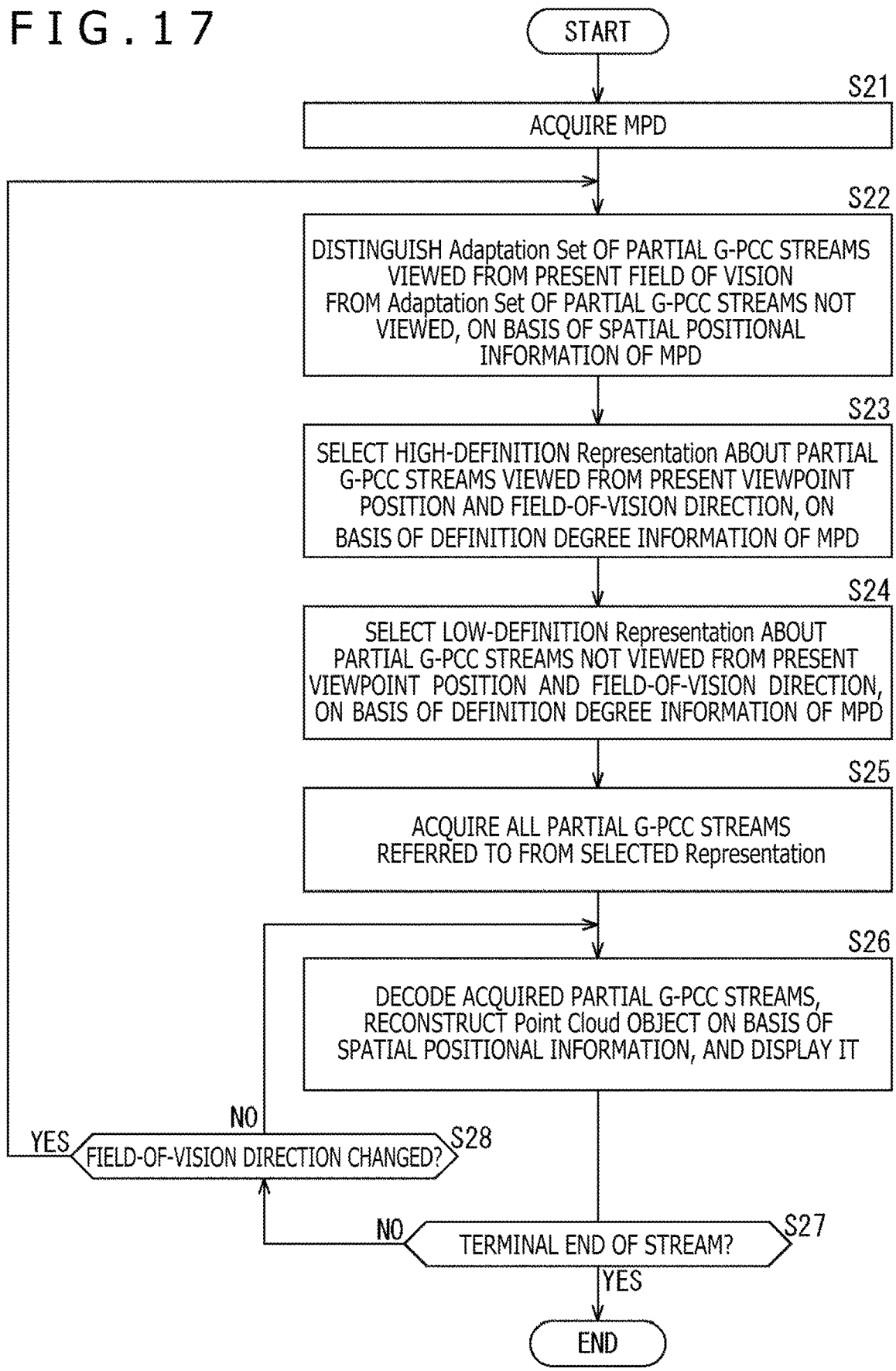
FIG. 17 is a flowchart that is illustrative of a reproducing process for reproducing files that store partial G-PCC streams.

FIG. 17 is a flowchart that is illustrative of a reproducing process in which the data reproducing device 12 reproduces files that store partial G-PCC streams.

In step S21, the acquiring section 51 acquires MPDs.

In step S22, the display controlling section 52 distinguishes AdaptationSets of partial G-PCC streams that can be viewed from a present field of vision from AdaptationSets of partial G-PCC streams that cannot be viewed, on the basis of the spatial positional information of the MPDs acquired by the acquiring section 51 in step S21.

In step S23, the display controlling section 52 selects high-definition Representation with respect to partial G-PCC streams that can be viewed from the present viewpoint position and field-of-vision direction, on the basis of the definition degree information of the MPDs.

In step S24, the display controlling section 52 selects low-definition Representation with respect to partial G-PCC streams that cannot be viewed from the present viewpoint position and field-of-vision direction, on the basis of the definition degree information of the MPDs.

In step S25, the acquiring section 51 acquires all the partial G-PCC streams referred to from the Representation selected by the display controlling section 52 in steps S23 and S24 and supplies the acquired partial G-PCC streams to the data analyzing and decoding section 53.

In step S26, the decoding section 56 of the data analyzing and decoding section 53 decodes the acquired partial G-PCC streams, and the display information generating section 57 thereof reconstructs the Point Cloud object on the basis of the spatial positional information and renders a display screen. Then, the display screen rendered by the display information generating section 57 is displayed by the displaying section 54.

In step S27, the display controlling section 52 determines whether or not the terminal end of the streams has been reached. In a case in which the display controlling section 52 determines that the terminal end of the streams has not been reached in step S27, then control goes to step S28.

In step S28, the display controlling section 52 determines whether or not the field-of-vision direction has been changed. In a case in which the display controlling section 52 determines that the field-of-vision direction has not been changed, then control goes back to step S26. In a case in which the display controlling section 52 determines that the field-of-vision direction has been changed, then control returns to step S22 and a similar processing sequence is repeated.

On the other hand, in a case in which the display controlling section 52 determines that the terminal end of the streams has been reached in step S27, then the processing sequence is ended.

Incidentally, it is assumed that mere signaling of the spatial positional information referred to above may lead to a situation where all the partial G-PCC streams that can be viewed from a particular viewing direction cannot be identified.

Figure 18:
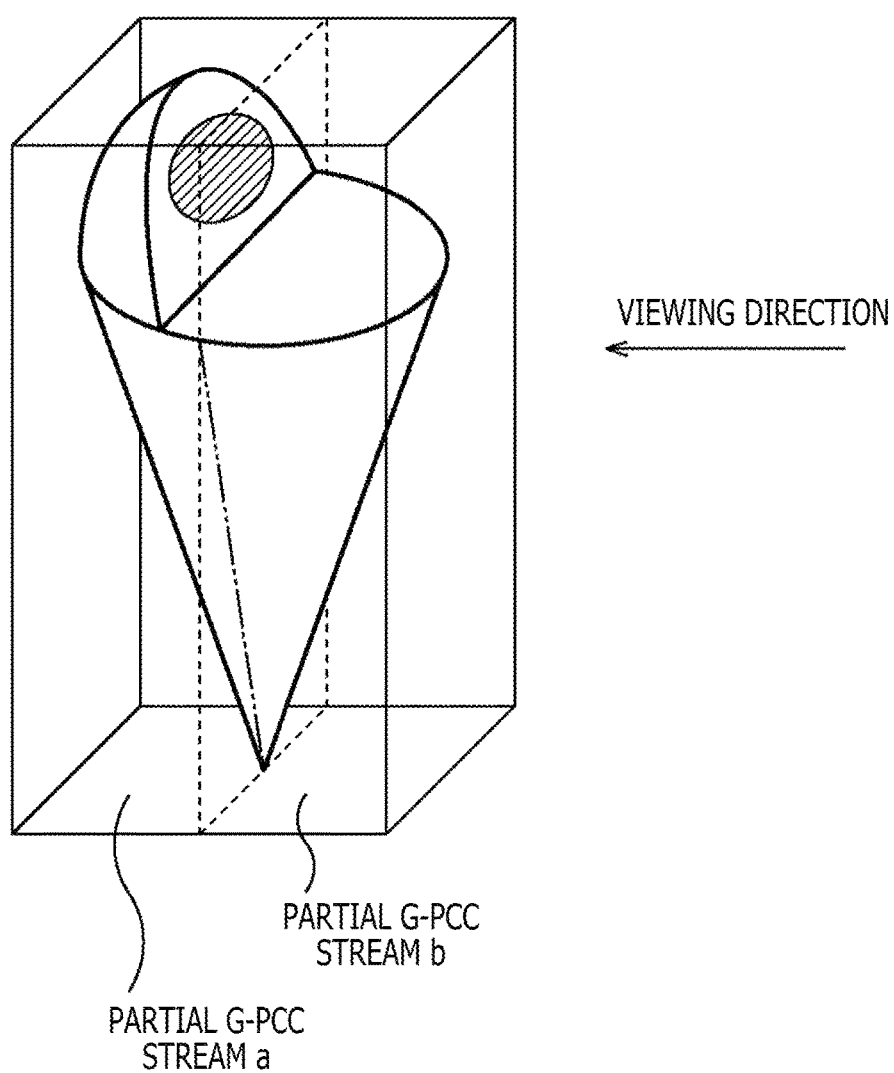
FIG. 18 is a diagram that is illustrative of the need for direction corresponding information of partial G-PCC streams.

For example, a region indicated hatched in FIG. 18 exists in a partial G-PCC stream a and can be viewed from the viewing direction indicated by an arrow in FIG. 18. At this time, in order to make the viewable part high in definition, it is necessary to acquire the partial G-PCC stream a in high definition in addition to a partial G-PCC stream b that is identified as a viewed part on the basis of spatial positional information. However, since the partial G-PCC stream a is acquired in low definition with only the signaling of the spatial positional information referred to above, a high-quality G-PCC stream distribution cannot be achieved.

Now, information for identifying all partial G-PCC streams that are needed for displaying is added to each direction based on the local coordinate system of the Point Cloud object.

For example, the direction corresponding information of the partial G-PCC streams is signaled by extending a block information descriptor. Specifically, the direction attribute of a gpcc:directionInfo element is added.

FIG. 19 illustrates an example of signaling of the direction corresponding information of partial G-PCC streams. The direction corresponding information of partial G-PCC streams is signaled at locations indicated by bold letters in FIG. 19.

For example, Adaptation Set@id="1" corresponds to a partial G-PCC stream a in FIG. 18 and indicates a partial G-PCC stream required for viewing in all the directions X+, Y+, X−, Y−, Z+, and Z−. Moreover, Adaptation Set@id="2" corresponds to a partial G-PCC stream b and indicates a partial G-PCC stream required for viewing in the directions X+, Y+, Y−, Z+, and Z−, and is not required for viewing in the direction X−.

By thus signaling the direction corresponding information, it is possible to properly identify partial G-PCC streams required for the viewing direction of the client and acquire them all in high definition.

Incidentally, in a case in which one partial G-PCC stream corresponds to a plurality of directions, directional information may not be signaled by blank separators in the direction attribute, but a plurality of gpcc:directionInfo elements may be signaled. Moreover, only the direction corresponding information of partial G-PCC streams may be signaled by individual descriptors.

Furthermore, in the case in which a gpcc:directionInfo element is signaled, a gpcc:blockInfo element may not be signaled, but may be used together therewith. In the case in which a gpcc:blockInfo element is used together with a gpcc:directionInfo element, all partial G-PCC streams required to display viewed parts can be identified by referring to the gpcc:directionInfo element, and then the definition degree per block can finely be changed by referring to the gpcc:blockInfo element.

Incidentally, in a case in which an outer shape of a Point Cloud object changes largely over time, generating point-free empty partial G-PCC streams, there is concern about a failure to appropriately perform an acquiring process depending on viewed parts.

The need for spatial positional information and direction corresponding information that are changed dynamically will be described below with reference to FIG. 20.

Figure 20:
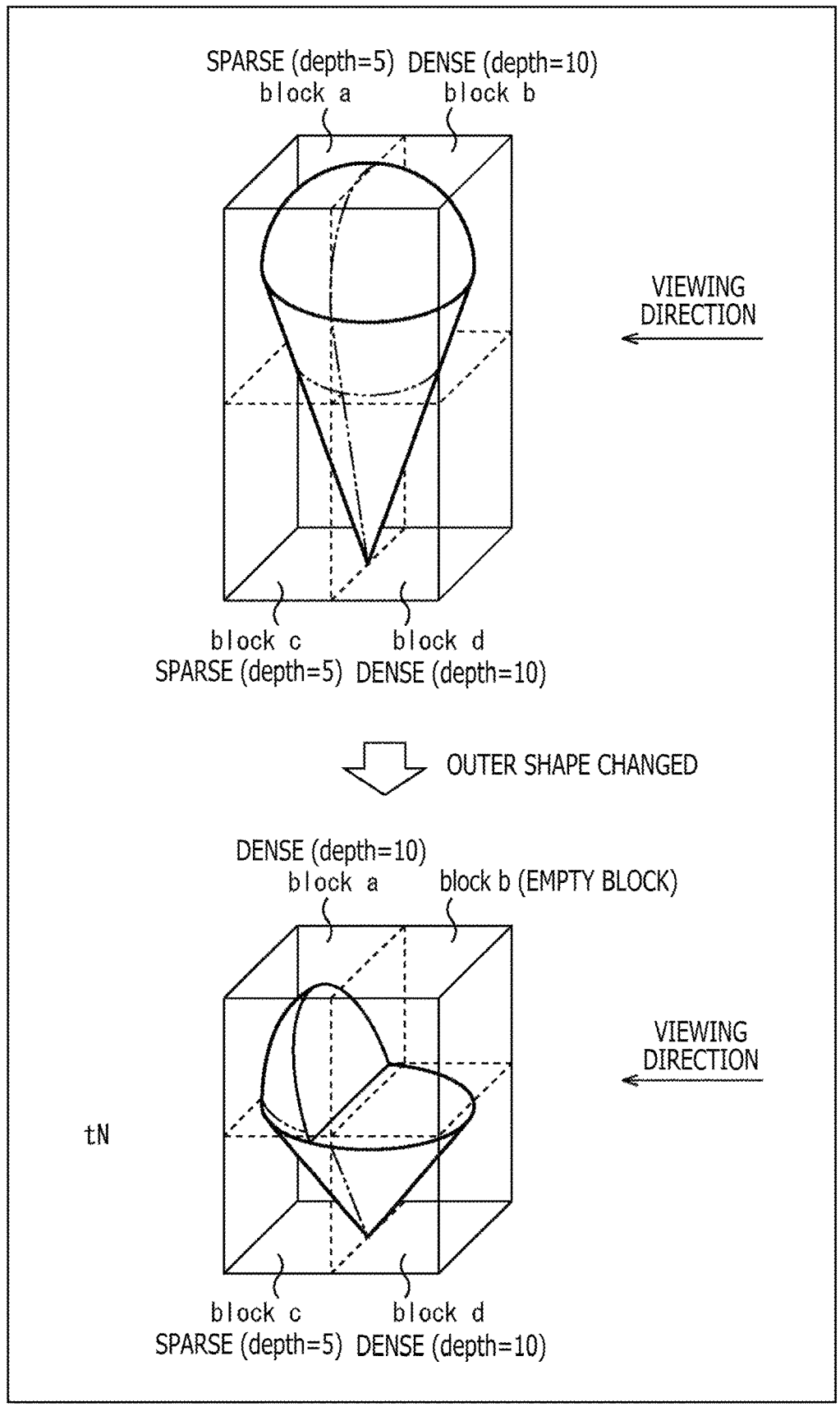
FIG. 20 is a diagram that is illustrative of the need for spatial positional information and direction corresponding information that are changed dynamically.

As illustrated in an upper section of FIG. 20, in the case in which the client makes viewed parts high in definition, the client acquires two partial G-PCC streams including block b and block d, respectively, that correspond to the viewed parts, in high definition (depth=10). Thereafter, as illustrated in a lower section of FIG. 20, in a case in which the outer shape of the Point Cloud object changes at time tN, the client acquires the partial G-PCC stream including block b in high definition though block b is empty.

Consequently, in order to make the viewed parts in high definition at time tN, it is necessary to acquire partial G-PCC streams including block a and block d, respectively.

Now, direction corresponding information and spatial positional information that are changed dynamically are added. Specifically, a dynamic block information descriptor (SupplementalProperty of schemeIdUri="urn:mpeg:mepgI:gpcc:dynamic_block_information:2018") is newly defined and signaled in AdaptationSet.

For example, id of Representation that refers to timed metadata linked to partial G-PCC streams that Representation in AdaptationSet refers to and signaling spatial positional information and direction corresponding information that are changed dynamically is signaled in a block_info_id attribute of a gpcc:dynamic BlockInfo element. Incidentally, the object_id attribute is as described above.

Moreover, Representation@associationId and Representation@associationType are used for Representation that refers to timed metadata, in order to link this Representation to Representation of partial G-PCC streams to which spatial positional information and direction corresponding information that are changed dynamically are applied. Furthermore, "dbif" indicating spatial positional information and direction corresponding information that are changed dynamically is signaled in associationType.

FIG. 21 illustrates an example of signaling of spatial positional information and direction corresponding information that are changed dynamically. Spatial positional information and direction corresponding information that are changed dynamically are signaled at locations indicated by bold letters in FIG. 21.

Specifically, direction corresponding information at each time is signaled in a sample of the timed metadata described above. This makes it possible to signal information indicating which direction each block corresponds to at each time.

FIG. 22 illustrates an example of a syntax of a sample entry of timed metadata, and FIG. 23 illustrates an example of a syntax of a sample of timed metadata.

Incidentally, semantics of a direction field is similar to the direction attribute of the gpcc:directionInfo element of the block information descriptor.

Furthermore, as illustrated in FIG. 24, spatial positional information at each time may be signaled. Since this allows a spatial segmentation process to be changed, it is possible to perform spatial segmentation such that no empty block will be produced.

Incidentally, semantics of each field is similar to the attribute having the same name of the gpcc:blockInfo element of the block information descriptor.

With such signaling, the client can refer to spatial positional information and direction corresponding information that are changed dynamically, and can appropriately acquire partial G-PCC streams for making viewed parts high in definition even in a case in which the outer shape of a Point Cloud object dynamically changes largely.

Extension of ISOBMFF will be described below with reference to FIGS. 25 and 26.

For example, partial G-PCC streams are stored in respective tracks of an ISOBMFF file. At this time, in order to clearly indicate a group of tracks that makes up one Point Cloud object, the tracks are grouped using a track group function defined by ISOBMFF.

Figure 25:
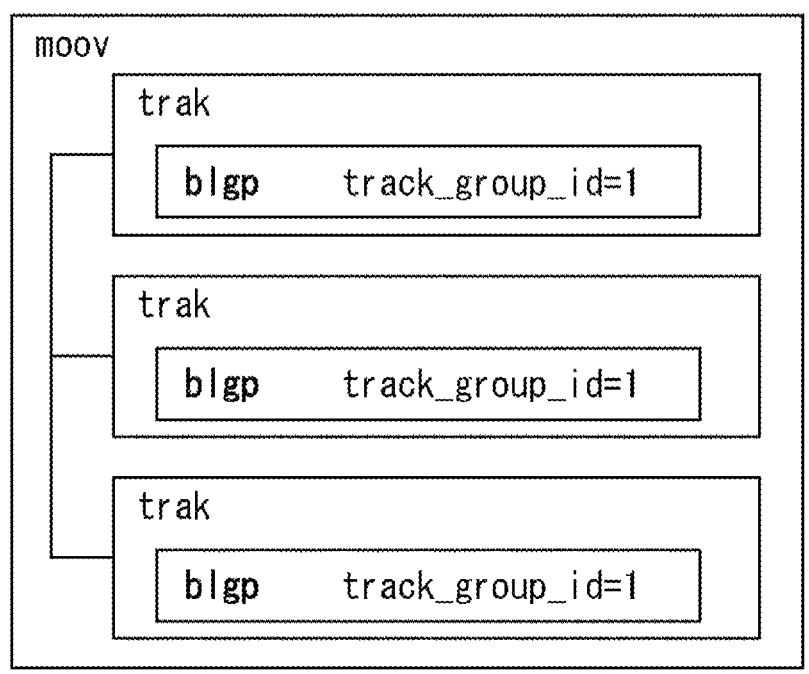
FIG. 25 is a diagram illustrating a signal example of BlockGroupBox.

Specifically, as illustrated in FIG. 25, TrackGroupType-Box is extended, and BlockGroupBox('blgp') is newly defined. In other words, tracks where BlockGroupBox of the same track_group_id is signaled indicate that partial G-PCC streams making up the same Point Cloud object are stored.

For example, as with the DASH MPD extension, the spatial positional information, definition degree information, and direction corresponding information of partial G-PCC streams and reference information to timed metadata having spatial positional information and direction corresponding information that are changed dynamically are signaled in BlockGroupBox. Incidentally, the timed metadata having spatial positional information and direction corresponding information that are changed dynamically is stored in tracks that are linked by a track reference of reference_type='dbif' to tracks that store partial G-PCC streams to which the timed metadata is applied.

The client is thus able to select tracks by referring to the information of this blgp and preferentially decode partial G-PCC streams corresponding to the viewed parts.

FIG. 26 illustrates an example of a syntax for signaling the spatial positional information of a partial G-PCC stream in BlockGroupBox. Here, the semantics of each field are similar to the attribute having the same name of the gpcc: blockInfo element of the block information descriptor.

Incidentally, a grouping may be signaled using EntityTo-GroupBox rather than the track group function. In addition, the definition degree information may be signaled in a sample entry of a track as an individual Box. Moreover, the spatial positional information and direction corresponding information that are changed dynamically may be signaled in a sample group.

Furthermore, providing a new Box having spatial positional information and definition degree information per spatial position is defined, it is possible to signal the definition degree information per spatial position for one G-PCC stream. Tracks storing G-PCC streams for high-definition viewed parts may be selected by referring to this Box.

The second process of the second point for distributing partial G-PCC streams generated by spatial segmentation will be described below with reference to FIGS. 27 through 29.

Figure 27:
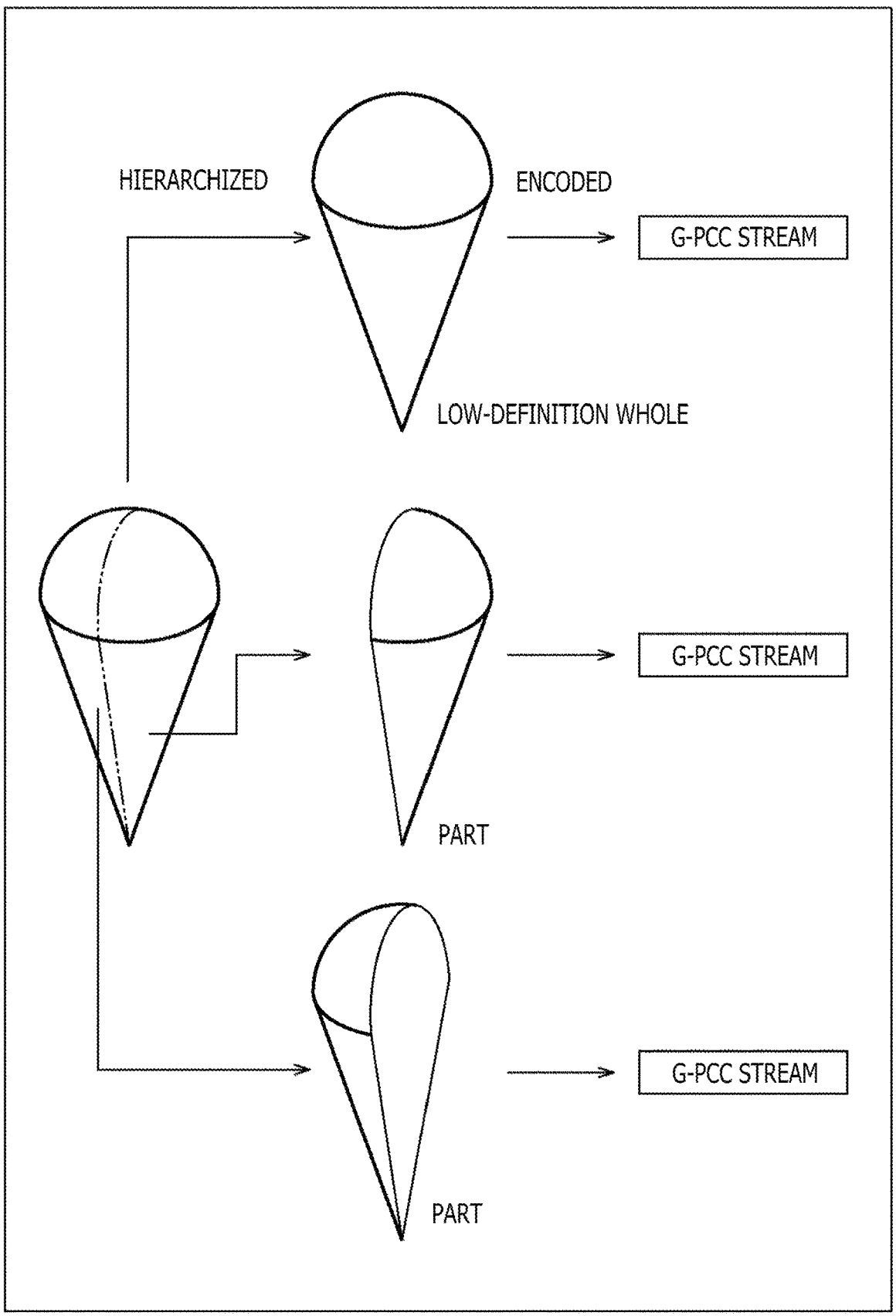
FIG. 27 is a diagram that is illustrative of a manner in which partial G-PCC streams are generated by hierarchization.

As illustrated in FIG. 27, the second process refers to a process of hierarchizing one Point Cloud object into a low-definition whole Point Cloud object and partial Point Cloud objects for making parts thereof high in definition, encoding those objects to generate partial G-PCC streams, and distributing the partial G-PCC streams. FIG. 27 illustrates an example in which a Point Cloud object is hierarchized into a low-definition whole Point Cloud object and two partial Point Cloud objects.

For example, partial G-PCC streams for making parts high in definition have the following variations.

Partial G-PCC streams that are of high definition on their own (variation 1)

Partial G-PCC streams that are of low definition on their own and make up high-definition parts in combination with a low-definition whole G-PCC stream (variation 2)

Incidentally, partial G-PCC streams that make parts high in definition according to the variation 2 have points that do not overlap the low-definition whole G-PCC stream.

With regard to the variation 1, by using the signaling similar to the first process of the second point, the client is able to identify the spatial positional information, grouping information, and definition degree information of a whole G-PCC stream and partial G-PCC streams and to acquire whole and partial G-PCC streams that make viewed parts high in definition.

With regard to the variation 2, though the similar signaling can be used, the client is unable to identify partial G-PCC stream and a whole G-PCC stream to be combined with each other for making viewed parts high in definition. Therefore, the client is unable to acquire appropriate G-PCC streams for making viewed parts high in definition.

Now, information for linking partial G-PCC stream and a whole G-PCC stream to be combined with each other for making viewed parts high in definition is signaled. Thus, the client is able to acquire partial G-PCC streams for making viewed parts high in definition according to the variation 2 by referring to the information.

Next, extension of DASH MPD will be described below with reference to FIGS. 28 and 29.

For example, using associationId and assocationType prescribed by MPEG-DASH, partial G-PCC streams and a whole G-PCC stream for making up high-definition parts in combination are linked to each other.

Then, Representation@id of the whole G-PCC stream to be combined is signaled in associationId in Representation of the partial G-PCC streams. Furthermore, "pbas" indicating that the linked Representation refers to the whole G-PCC stream that can achieve high definition in combination with the partial G-PCC streams is signaled in associationType.

The definition degree information that indicates the result of the combination of both of the G-PCC streams is signaled in gpcc:combinedAreaLodInfo by extending the lod information descriptor defined by the first process of the second point described above. Furthermore, Representation@id of the whole G-PCC stream to be combined is signaled in a combined_rep_id attribute, and the definition degree information that indicates the result of the combination of both of the G-PCC streams is signaled in a lod_ranking attribute.

FIG. 28 illustrates an example of signaling the spatial positional information of the G-PCC streams to be combined. In FIG. 28, the spatial positional information of the G-PCC streams to be combined is signaled at locations indicated by bold letters.

Figure 29:
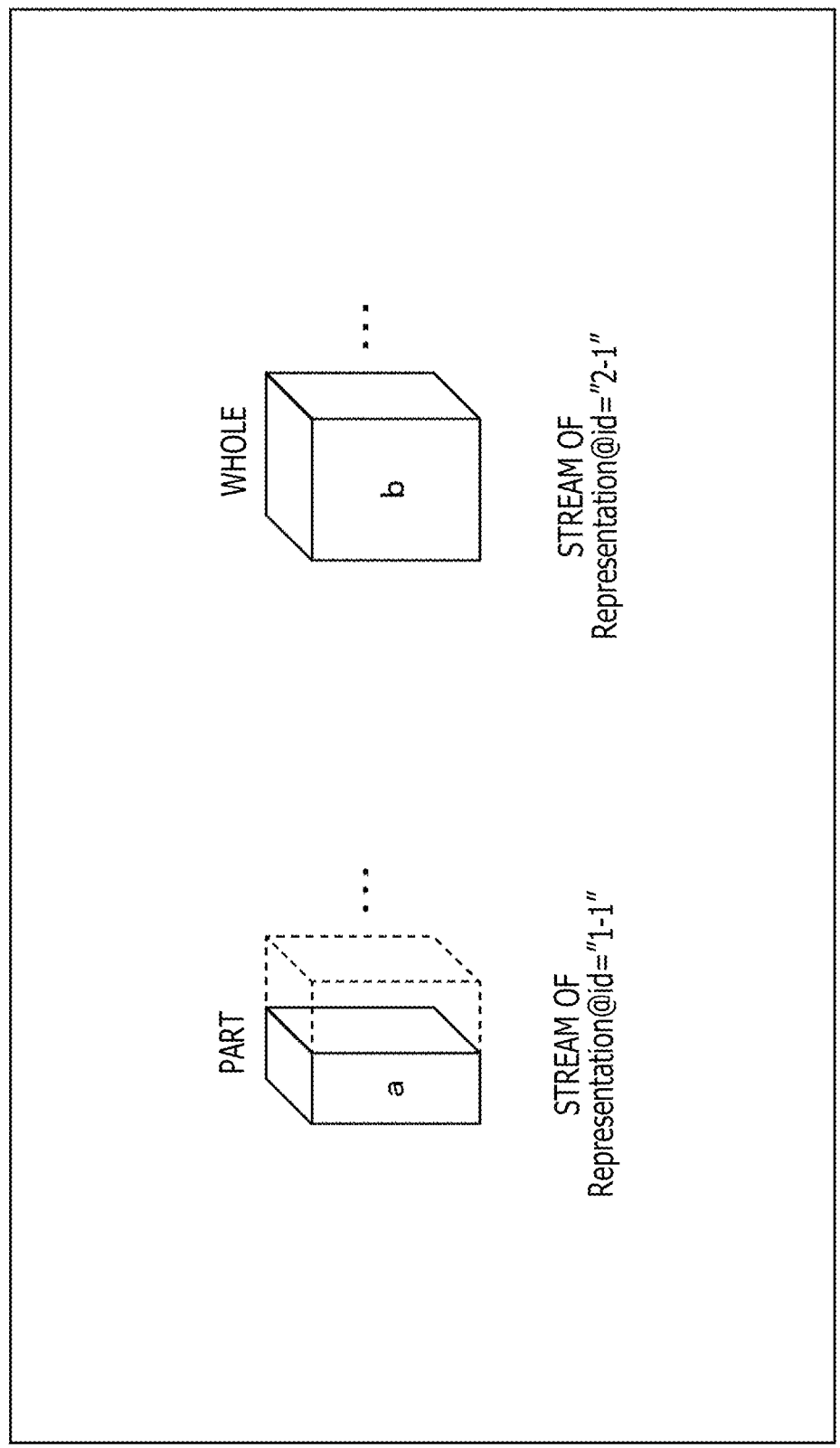
FIG. 29 is a diagram illustrating a visual representation of spatial positional information.

FIG. 29 illustrates a visual representation of the spatial positional information signaled as illustrated in FIG. 28.

Incidentally, no linking by associationId and assocationType indicates that high definition is achieved by partial G-PCC streams on their own.

Further, in a case in which partial G-PCC streams are of low definition and are to be inhibited from being reproduced on their own, linking is accomplished by dependencyId rather than associationId. Alternatively, a descriptor for inhibiting individual reproduction may be defined using SupplementalProperty or EssentialProperty.

Moreover, partial G-PCC streams may be referred to from a whole G-PCC stream, using associationId and assocation-Type.

With this signaling, the client is able to acquire suitable G-PCC streams for making viewed parts high in definition in combination with each other.

Incidentally, this signaling can also be used for producing high-definition parts by combining low-definition partial G-PCC streams with each other.

Next, extension of ISOBMFF will be described below with reference to FIGS. 30 and 31.

Figure 30:
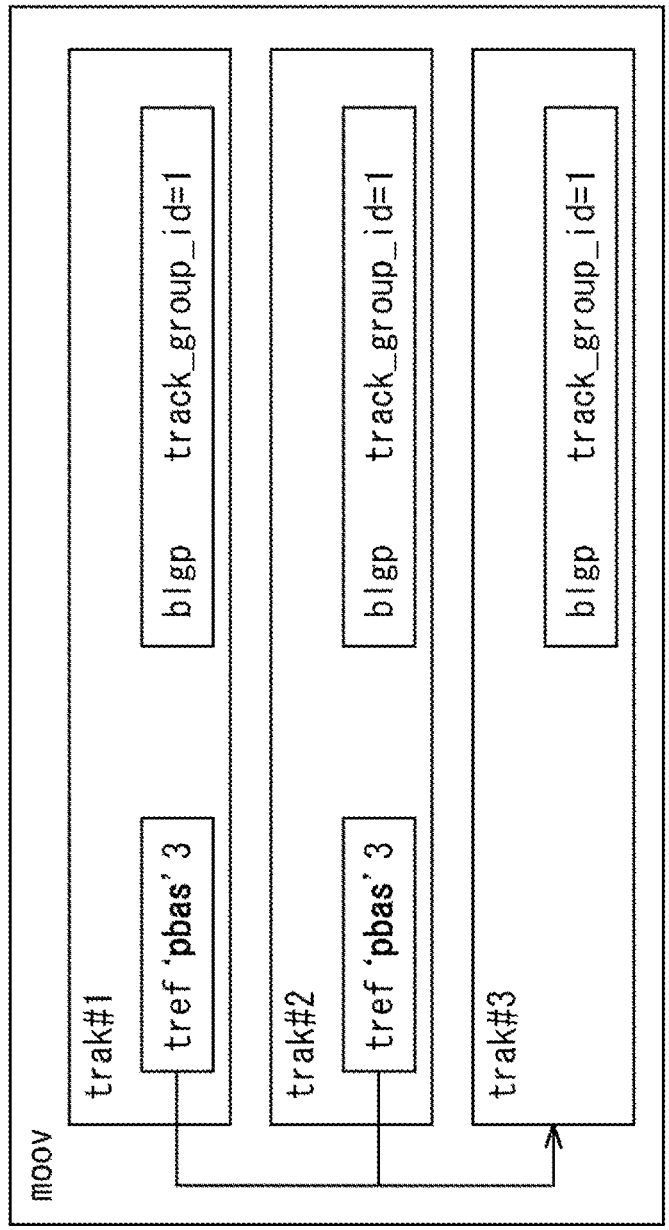
FIG. 30 is a diagram illustrating an example in which track reference is applied.

As illustrated in FIG. 30, partial G-PCC streams generated by hierarchization are stored in respective tracks of an ISOBMFF file. At this time, partial G-PCC streams and a whole G-PCC stream that produce high-definition parts in combination with each other are linked to each other by using the principle of a track reference defined by ISOBMFF. Incidentally, the reference_type is set to 'pbas.'

For example, track #3 stores a low-definition whole G-PCC stream, and track #1 and track #2 store partial G-PCC streams corresponding to respective different parts of a whole Point Cloud object. Then, tref of reference_type='pbas' indicates that high-definition parts are produced in combination with the whole G-PCC stream in track #3.

The client is thus able to select and reproduce tracks storing suitable G-PCC streams that make viewed parts high in definition in combination with each other, according to signaling of the track reference.

Furthermore, CombinedAreaLodInfoBox('cloi') for signaling definition degree information that indicates the result of the combination of a plurality of G-PCC streams is newly defined and signaled in BlockGroupBox defined by the first process of the second point described above.

FIG. 31 illustrates a syntax of CombinedAreaLodInfoBox ('cloi').

As illustrated in FIG. 31, definition degree information in combination with a track indicated by a combined_track_id field is signaled in a lod_ranking field. The semantics of the lod_ranking field is similar to the field having the same name of DirectionInformationBox according to the first point described above.

The second point described above is applicable to 3D objects in general, for example, not only objects including G-PCC streams, but also objects including Video-based-PCC(V-PCC)-encoded streams, mesh streams, and texture streams.

<Modifications of First and Second Points>

Here, modifications of the first and second points will be described below.

For example, in the first point, a unit for changing the fineness with which Voxels are demarcated to change a definition degree may be a collection of points that can independently be encoded and decoded in a Point Cloud object. The collection of points is referred to as a brick. A brick may be a tile representing an encoding tool that is currently being discussed by MPEG. A tile is a collection of slices, and a slice is a collection of points that can independently be encoded and decoded (see NPL 2 referred to above).

Further, in the second point, a partial G-PCC stream may be encoded such that it includes one brick or a plurality of bricks.

At any rate, the signaling described above according to the first and second points is applicable.

Moreover, by encoding one G-PCC stream such that it includes a plurality of bricks, it is possible to preferentially decode and render them from a brick corresponding to a viewed part. This is a use case valuable for clients whose decoding and rendering performance is low.

In addition, according to the conventional technology using tiles of MPEG, it is assumed that the spatial positional information of brick data in a G-PCC stream is signaled in the G-PCC stream. In this case, in order to access the brick data corresponding to a viewed part, it is necessary to decode the G-PCC stream once, resulting in a large processing overhead. Furthermore, in a case in which a brick corresponding to a viewed part is selected and decoded, it is necessary to link the spatial positional information of the brick in units of data making up the brick in the G-PCC stream, similarly to the first process of the second point described above.

Extension of ISOBMFF for linking the spatial positional information of a brick in units of data making up the brick in a G-PCC stream will be described below with reference to FIGS. 32 through 37.

For example, the spatial positional information of bricks can be linked in units of data making up bricks in a G-PCC stream, by using the function of a sample group defined by ISOBMFF. Specifically, BrickGroupEntry for signaling the spatial positional information of each brick and UnitMapEntry for linking the spatial positional information of each brick in units of data making up bricks in a G-PCC stream are newly defined.

FIG. 32 illustrates a syntax of BrickGroupEntry, and FIG. 33 illustrates a syntax of UnitMapEntry.

In the syntaxes illustrated in FIGS. 32 and 33, the semantics of brick_offset_x, brick_offset_y, brick_offset_z, brick_size_x, brick_size_y, and brick_size_z of BrickGroupEntry are identical respectively to those of block_offset_x, block_offset_y, block_offset_z, block_size_x, block_size_y, and block_size_z of BlockGroupBox according to the first process of the second point described above.

Furthermore, unit_index of UnitMapEntry represents index information in units of data making up bricks in a G-PCC stream to which BrickGroupEntry linked by groupID is applied.

This unit_index may be assigned per unit of data making up a brick with respect to a Geometry bitstream and an Attribute bitstream that make up a brick in a G-PCC stream to which BrickGroupEntry linked by groupID is applied.

Incidentally, in a case in which a tile representing an encoding tool that is currently being discussed by MPEG is applied, areas signaled by brick_offset_x, brick_offset_y, brick_offset_z, brick_size_x, brick_size_y, and brick_size_z of BrickGroupEntry coincide with the area of a bounding box of a tile or a total area of bounding boxes of a plurality of tiles.

FIG. 34 illustrates an example in which BrickGroupEntry and UnitMapEntry are applied.

As illustrated in FIG. 34, one Point Cloud frame of a G-PCC stream is used as one ISOBMFF sample, and a unit of data making up a brick represents one Attribute bitstream (Attr) or a plurality of Attribute bitstreams (Attr) linked to a Geometry bitstream (Geom).

For example, in a case in which the client is to decode only bricks corresponding to viewed parts, the client first refers to each BrickGroupEntry of SampleGroupDescriptionBox of grouping_type='blif' to identify groupID of a desired brick. Next, the client refers to SampleToGroupBox and SampleGroupDescriptionBox of grouping_type='unim.' If unit_index of groupID of the desired brick is included in UnitMapEntry to which each sample is linked, then the client decodes only the unit in the sample.

Figure 35:
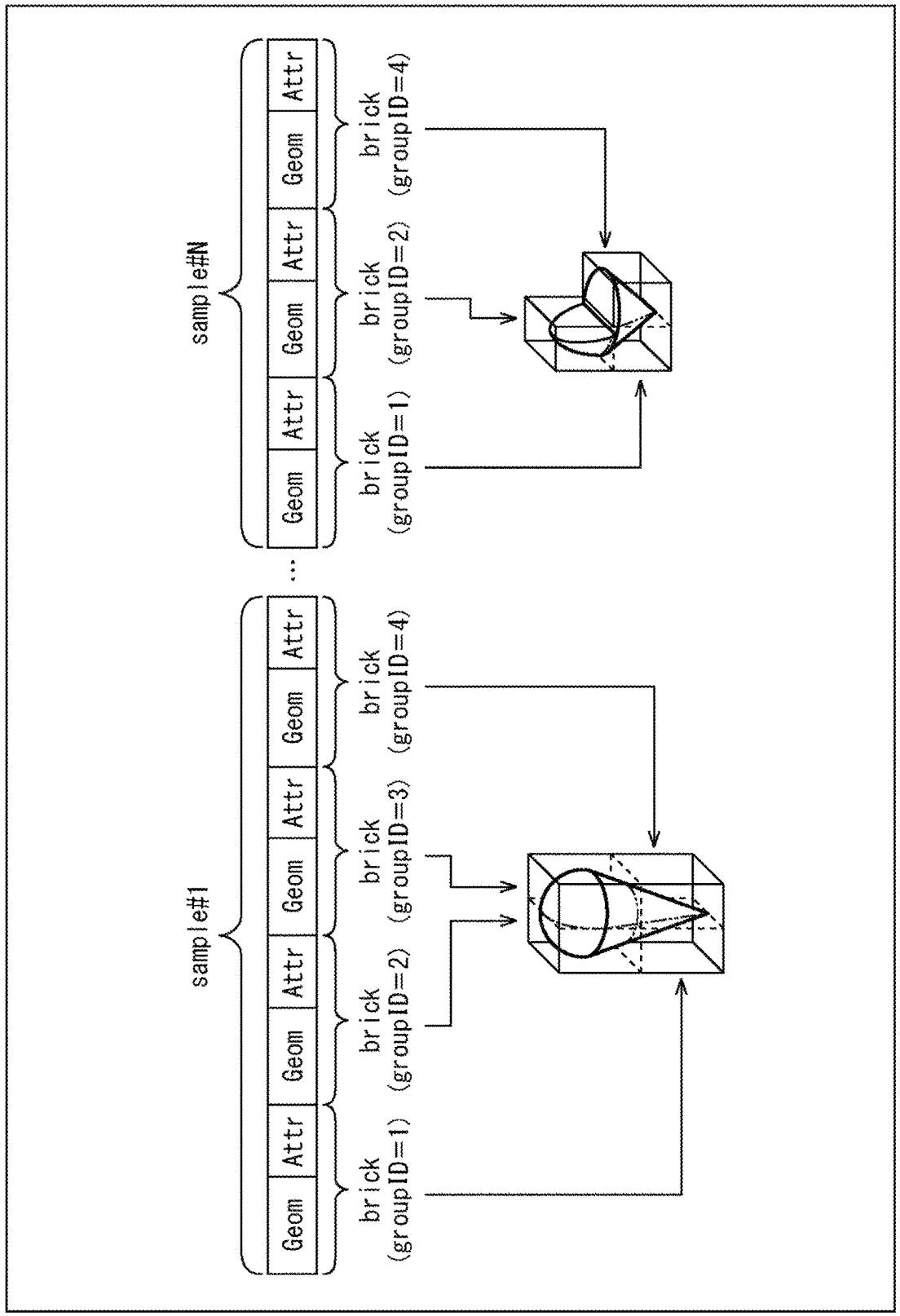
FIG. 35 is a diagram that is illustrative of a manner in which a dynamic brick configuration is changed.

With this signaling, as illustrated in FIG. 35, the client is able to change a brick configuration dynamically in a manner to match movement of the object, eliminating empty bricks.

Then, by referring to these signaling, it is possible to directly access brick data corresponding to viewed parts and preferentially decode and render the brick data.

According to a modification, furthermore, an object may be segmented per brick and the segments may be stored individually in ISOBMFF tracks. For example, two kinds of a brick base track and a brick track are defined.

A brick base track does not store G-PCC streams, but stores in its sample entry the profile and level of a whole G-PCC stream and a common parameter set required to decode G-PCC streams stored in the brick track. Incidentally, the type of a sample entry is set to 'gpbb.'

A brick track stores G-PCC streams each including one brick or a plurality of bricks, and stores in its sample entry the profile and level of a G-PCC stream stored in the track and a parameter set required to decode G-PCC streams stored therein. Incidentally, the type of a sample entry is set to 'gpcb.'

Furthermore, a track reference of reference_type='gpbt' is signaled from the brick base track to the brick track, and the track reference of reference_type='gpbb' is signaled from the brick track to the brick base track.

Figure 36:
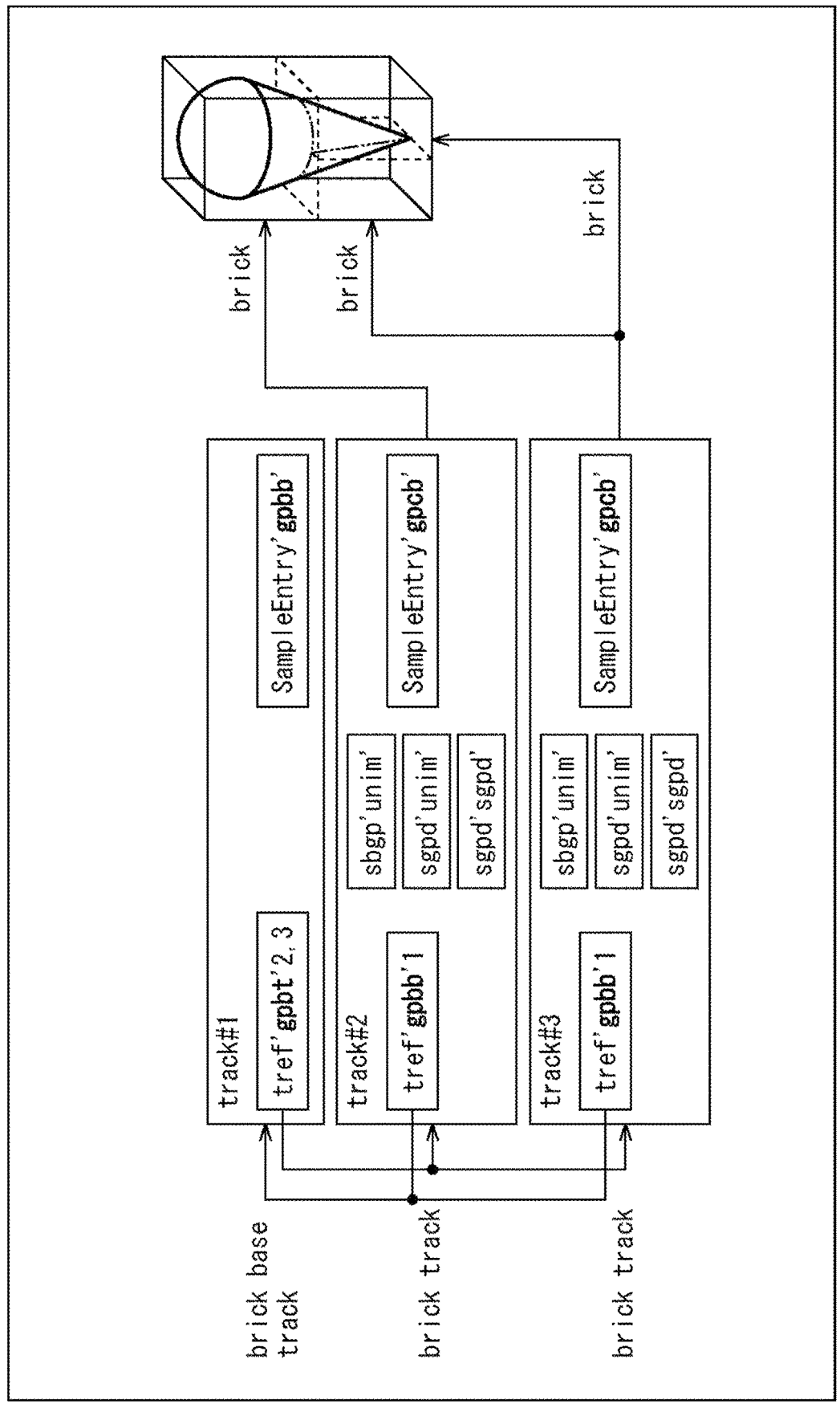
FIG. 36 is a diagram that is illustrative of a configuration of brick base track and brick track.

FIG. 36 illustrates a configuration of a brick base track and brick tracks.

With signaling as illustrated in FIG. 36, the client is able to decode a brick track on its own by referring to a parameter set stored in the brick track and a parameter set stored in the linked brick base track. In other words, it is possible to select brick tracks including brick data corresponding to viewed parts and preferentially decode and render them.

Moreover, the client is able to reconstruct a whole G-PCC stream on the basis of the samples of G-PCC streams stored in the brick tracks referred to from the brick base track, and decode the whole G-PCC stream with a single decoder.

Incidentally, each brick track may be grouped by a track group or EntityToGroupBox, and in the case of a track group based on a track reference from a brick base track, track_group_id may be referred to, and in the case of EntityToGroup, group_id may be referred to.

The signaling due to such ISOBMFF extension is applicable to not only streams including bricks, but also partial G-PCC streams referred to in the second point described above. In the latter case, a brick may be regarded as a block.

Furthermore, as illustrated in FIG. 37, the spatial positional information (brick_offset_x, brick_offset_y, brick_offset_z, brick_size_x, brick_size_y, and brick_size_z) of a brick may be signaled by extending a high level syntax of an elementary stream.

For example, a data unit making up bricks in a G-PCC stream is linked to spatial positional information through brick_id.

When decoding a G-PCC stream, the client is thus able to easily identify an overall brick configuration by referring to a brick_inventory, and identify a data unit of bricks corresponding to viewed parts through brick_id and decode it.

<Third Point>

The third point for specifying a rendering process for low-definition parts of a Point Cloud object will be described below with reference to FIGS. 38 through 43.

For example, if low-definition parts of a Point Cloud object are rendered as they are, then the subjective quality thereof is lowered as represented by an example in which the opposite side of the Point Cloud object is seen through. At this time, the subjective quality can be increased by rendering the low-definition parts such that the size of their points is increased.

Therefore, when a content producer specifies a rendering process required to increase the subjective quality of low-definition parts and the client performs the specified rendering process, the subjective quality of low-definition parts of a Point Cloud object is increased according to the intention of the content producer.

However, it is assumed that parameters required by a rendering process for increasing the subjective quality are signaled in G-PCC streams, and the client cannot determine whether or not a subjective quality increasing rendering process is required at the time of selecting G-PCC streams.

Consequently, the client determines whether or not a rendering process needs to be executed after having acquired streams. In a case in which the client does not deal with a rendering process for increasing the subjective quality, then an appropriate rendering process cannot be performed.

Alternatively, the client acquires again other streams that do not require a rendering process for increasing the subjective quality, resulting in a reduction in processing efficiency.

Therefore, by signaling information for determining whether or not a rendering process for increasing the subjective quality of low-definition G-PCC streams is required, it is possible to avoid a failure to perform an appropriate rendering process and a reduction in processing efficiency.

With such signaled information, the client takes into account its own subjective quality increasing rendering process capability, acquires low-definition G-PCC streams if it can process them, and performs a rendering process for increasing the subjective quality, thereby maintaining the subjective quality and reducing the network bandwidth required for distributing G-PCC streams.

Here, extension of DASH MPD will be described below.

For example, as a rendering process for G-PCC streams, a rendering information descriptor (EssentialProperty of schemeIdUri="urn:mpeg:mepgI:gpcc: rendering_information:2018") is newly defined and signaled in Representation.

Then, the rendering process is signaled by a type attribute of a gpcc:renderingInfo element. When type=0, it indicates rendering with Voxel shapes, which is a general rendering method, and when type=1, it indicates a rendering process performed according to parameters signaled in G-PCC streams. Parameters in G-PCC streams represent, for example, rendering a sphere inscribed in a Voxel.

FIG. 38 illustrates an example of signaling of a rendering process. A rendering process is signaled at locations indicated by bold letters in FIG. 38.

For example, if the client deals with a rendering process for increasing the subjective quality, then the client can acquire Representation of id=1-3, i.e., streams of lower definition, in a case in which the band is narrow, thereby reducing the network bandwidth required for distributing G-PCC streams.

Incidentally, a process signaled in the type of a gpcc:renderingInfo element may not be forced, but may be recommended for the content producer.

Next, extension of ISOBMFF will be described below.

For example, the information of a subjective quality increasing rendering process is signaled as post decoding information in an ISOBMFF track.

Specifically, RestrictedSchemeInformationBox ('rinf') defined by ISOBMFF under sample entry is used. rinf represents Box for storing post process information after decoding. scheme_type of SchemeTypeBox('schm') under rinf is set to 'rndi' in order to indicate that subjective quality increasing rendering information is stored.

Figure 39:
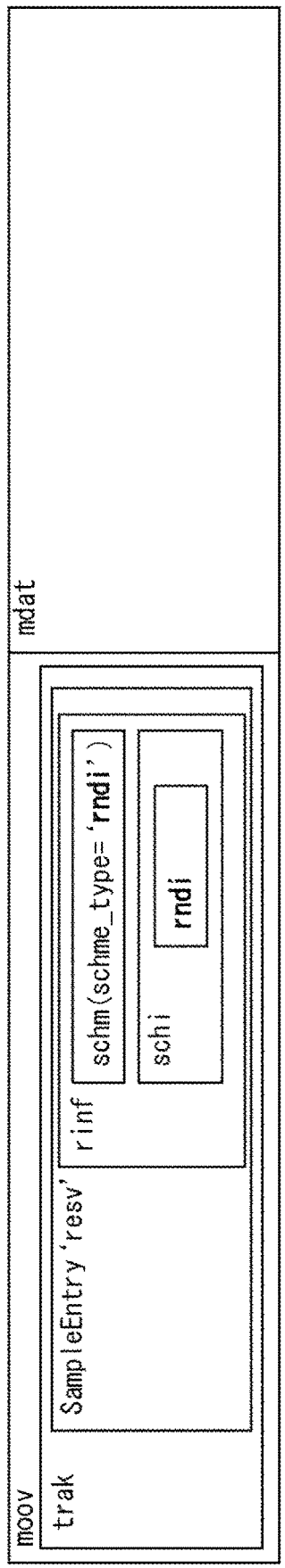
FIG. 39 is a diagram illustrating a signal example of RenderingInformationBox.

FIG. 39 illustrates a signal example of RenderingInformationBox.

As illustrated in FIG. 39, SchemeInformationBox('schi') represents Box for storing information specified by scheme_type of schm, and RenderingInformationBox('rndi') corresponding to scheme_type='rndi' is signaled therein.

FIG. 40 illustrates an example of a syntax of RenderingInformationBox.

Incidentally, semantics of a type field is similar to the attribute having the same name of the gpcc:renderingInfo element of the rendering information descriptor.

With the signaling illustrated in FIG. 40, the client is able to identify the type of rndi and perform an appropriate rendering process. Furthermore, in a case in which the client is unable to perform a rendering process signaled by the type of rndi, the client can perform a process of not selecting its track and selecting another track in the same ISOBMFF file.

Here, a modification of the third point will be described below.

For example, in a case in which a rendering process is applied to the distribution of partial G-PCC streams generated by hierarchization as with the second process of the second point described above, parts that are made high in definition in combination with other G-PCC streams do not require a rendering process for increasing the subjective quality. At this time, the client needs to change the rendering process for increasing the subjective quality per part of a Point Cloud object. Therefore, only the client that can perform an appropriate rendering process adds information for acquiring the G-PCC streams described above.

For example, the processing type for parts that are made high in definition in combination with other G-PCC streams can be signaled.

Here, extension of DASH MPD will be described below.

For example, a rendering information descriptor is extended, and the processing type for parts that are made high in definition in combination with other G-PCC streams is signaled.

Specifically, a gpcc:combinedAreaRenderingInfo element is added, and Representation@id of G-PCC streams combined according to its combined_rep_id attribute is signaled. Furthermore, the processing type for parts that are made high in definition in combination is signaled in the type attribute of the gpcc:combinedAreaRenderingInfo element. Incidentally, the semantics is identical to the type attribute of the gpcc:renderingInfo element.

FIG. 41 illustrates a syntax of a processing type for parts that are made high in definition. The processing type for parts that are made high in definition is signaled at locations indicated by bold letters in FIG. 41.

With the signaling illustrated in FIG. 41, based on the types of the gpcc:renderingInfo element and the gpcc:combinedAreaRenderingInfo element, the client who can change and apply its client processing ability, e.g., a rendering process for increasing the subjective quality per part of a Point Cloud object, is able to acquire streams of lower definition.

Next, extension of ISOBMFF will be described below.

For example, RenderingInformationBox('rndi') described above is extended, and a combined_track_exists field, a combined_track_id field, and a combined_area_type field are signaled.

Furthermore, the combined_track_exists field indicates whether or not the track reference of reference_type='pbas' is linked to G-PCC streams making up high-definition parts in combination. The combined_track_id field signals the track_id of G-PCC streams to be combined. The combined_area_type field signals the processing type of parts to be made high in definition in combination.

With those fields, the client is able to identify the above-mentioned information and perform an appropriate rendering process.

FIG. 42 illustrates a syntax where a combined_track_exists field, a combined_track_id field, and a combined_area_type field are added. The combined_track_exists field, the combined_track_id field, and the combined_area_type field are signaled at locations indicated by bold letters in FIG. 42.

Furthermore, in a case in which there are points that positionally coincide with each other and that overlap each other with respect to parts that are made high in definition in combination, information indicating which point of the G-PCC streams to be combined is to be rendered may be signaled. This information makes it possible for the client to perform a rendering process according to the intention of the content producer.

Specifically, RenderingInformationBox is further extended, and a priority_flag field is added. In the case of priority_flag=1, it indicates that a G-PCC stream in a track having the RenderingInformationBox has higher rendering priority than a G-PCC stream in a track of combined_track_id. With respect to overlapping points, only the point of a G-PCC stream in a track of priority_flag=1 is rendered. On the other hand, in the case of priority_flag=0, with respect to overlapping points, only the point of a G-PCC stream in a track of combined_track_id is rendered.

FIG. 43 illustrates a syntax where a priority_flag field is added. The priority_flag field is signaled at locations indicated by bold letters in FIG. 43.

Figure 44:
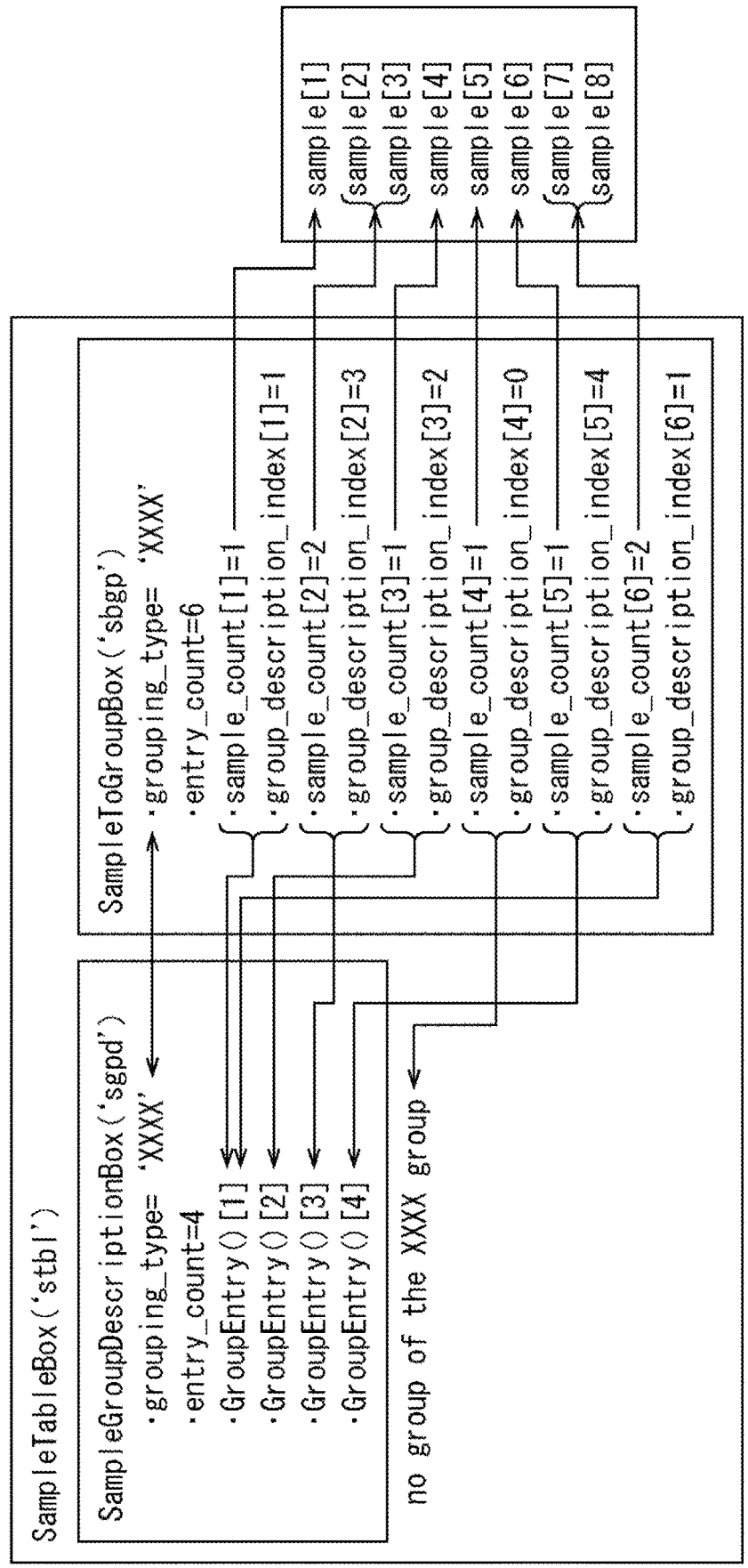
FIG. 44 is a diagram illustrating a Sample Group summary.

Here, FIG. 44 illustrates a Sample Group summary described above.

grouping_type of SampleToGroupBox illustrated in FIG. 44 indicates grouping_type of SampleGroupDescriptionBox that is linked. Furthermore, sample_count and group_description_index are signaled per entry. group_description_index indicates index of GroupEntry that is linked, and sample_count indicates the number of samples belonging to that GroupEntry.

According to the present technology, as described above, when G-PCC streams that are Point Cloud streams produced by encoding a Point Cloud object on a Geometry base are to be distributed depending on parts viewed by the user, according to the first point, it is possible to distribute G-PCC streams encoded at different definition degrees with respect to respective parts of the Point Cloud object. Furthermore, according to the second point, a Point Cloud object can be segmented into a plurality of partial objects, and partial G-PCC streams produced by encoding the partial objects at respective different definition degrees can be distributed.

When G-PCC streams are to be distributed according to the first point, directional information that points to high definition and definition degree information are added to the G-PCC streams, and the client can refer to the information and can acquire G-PCC streams that make viewed parts high in definition.

Alternatively, when partial G-PCC streams are to be distributed according to the second point, spatial positional information and definition degree information are added to the partial G-PCC streams, and the client can refer to the information and can acquire partial G-PCC streams that make viewed parts high in definition.

Furthermore, according to the third point, it is possible to add information indicating whether or not a rendering process effective to increase the subjective quality of low-definition parts, i.e., parts where points are sparse, is required. With the added information, the client, providing that it can perform the rendering process, can acquire G-PCC streams including lower-definition parts, thereby reducing the network bandwidth required to distribute G-PCC streams.

Incidentally, the added information is signaled by extending DASH MPD or ISOBMFF.

By then distributing G-PCC streams such that parts viewed by the user are of high definition and parts other than the parts viewed by the user are of low definition according to the above points, the network bandwidth can be effectively used to distribute high-quality, i.e., uninterrupted high-definition, G-PCC streams.

<Configurational Example of Computer>

Next, the processing sequences (information processing method) described above can be implemented by hardware or can be implemented by software. In a case in which the processing sequences are implemented by software, programs of the software are installed in a general-purpose personal computer or the like.

Figure 45:
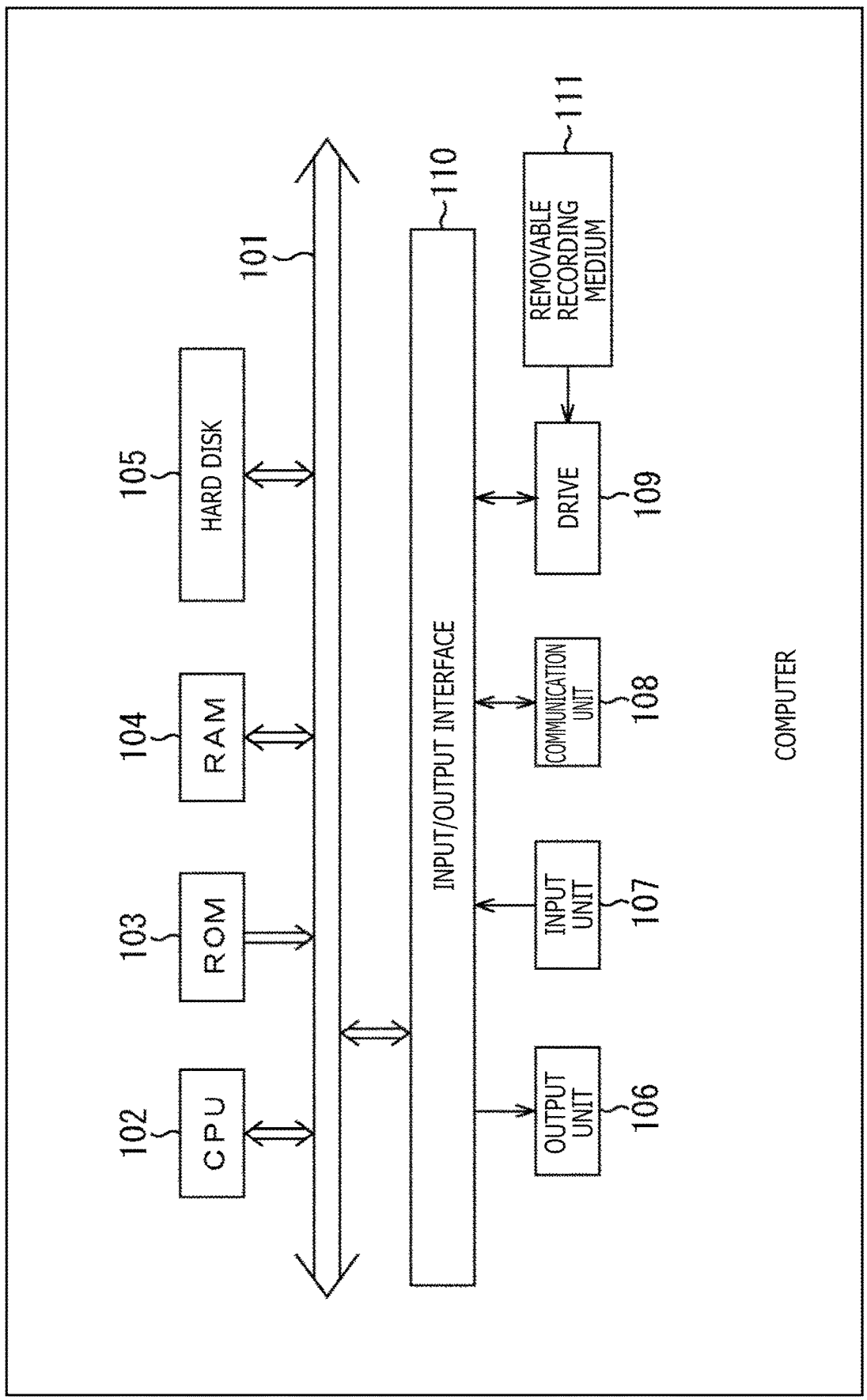
FIG. 45 is a block diagram illustrating a configurational example of a computer according to an embodiment of the present technology.

FIG. 45 is a block diagram illustrating a configurational example of a computer according to an embodiment in which programs for carrying out the above processing sequences are installed.

The programs may be recorded in advance in a hard disk 105 or a ROM 103 as a recording medium included in the computer.

Alternatively, the programs may be stored (recorded) in a removable recording medium 111 driven by a drive 109. The removable recording medium 111 may be provided as what is called packaged software. The removable recording medium 111 may be, for example, a flexible disc, a CD-ROM (Compact Disc Read Only Memory), an MO (Magneto-Optical) disc, a DVD (Digital Versatile Disc), a magnetic disc, a semiconductor memory, or the like.

Incidentally, the programs may be downloaded into the computer through a communication network or a broadcasting network and installed in the hard disk 105 in the computer, rather than being installed into the computer from the removable recording medium 111 described above. In other words, the programs may be transferred from download sites via an artificial satellite for digital satellite broadcasting to the computer through a wireless link, or may be transferred to the computer via a network such as a LAN (Local Area Network) or the Internet through a wired link.

The computer incorporates a CPU (Central Processing Unit) 102 to which an input/output interface 110 is connected through a bus 101.

When a command is input to the CPU 102 through the input/output interface 110 by a user who operates an input unit 107, the CPU 102 executes programs stored in a ROM (Read Only Memory) 103. Alternatively, the CPU 102 loads programs stored in the hard disk 105 into a RAM (Random Access Memory) 104 and executes the loaded programs.

The CPU 102 thereby performs processing sequences according to the flowcharts described above or processing sequences to be carried out by the arrangements illustrated in the block diagrams described above. Then, the CPU 102 outputs the processed results from an output unit 106 through the input/output interface 110, transmits the processed results from a communication unit 108, or records the processed results in the hard disk 105, for example, as necessary.

Incidentally, the input unit 107 includes a keyboard, a mouse, a microphone, and so on. Furthermore, the output unit 106 includes an LCD (Liquid Crystal Display), a speaker, and so on.

In the present specification, the processing sequences that the computer performs according to the programs do not necessarily need to be carried out in a chronological order according to the sequences described as the flowcharts. In other words, the processing sequences that the computer performs according to the programs include processing sequences to be performed concurrently or individually (e.g., parallel processing sequences or processing sequences based on objects).

Moreover, the programs may be processed by one computer (processor) or may be processed by a plurality of computers in a distributed fashion. Further, the programs may be transferred to a remote computer to be executed.

Further, in the present specification, a system means a set of a plurality of components (devices, modules (parts), etc.), and it does not matter whether or not all the components are housed in one housing. Therefore, a plurality of devices housed in separate housings and interconnected through a network, and a single device having a plurality of modules housed in a single housing are all referred to as a system.

Moreover, for example, an arrangement described as one device (or processor) may be divided into plural devices (or processors). Conversely, arrangements described above as a plurality of devices (or processors) may be arranged together as one device (or processor). In addition, arrangements other than those described above may be added to the arrangement of each device (or each processor). Further, providing that an overall system remains essentially the same in arrangement or operation, part of the arrangement of a device (or processor) may be included in the arrangement of another device (or another processor).

Moreover, for example, the present technology may be configured as a cloud computing system in which one function is shared by and processed in collaboration with a plurality of devices via a network.

Further, for example, the programs described above may be executed by any device. In that case, it is sufficient if the device has necessary functions (functional blocks etc.) and is able to obtain necessary information.

Further, each of the steps described in the above flowcharts can be executed by a single device or plural devices operating in collaboration with each other. Furthermore, in a case in which a single step includes a plurality of processing sequences, the processing sequences included in the single step can be executed by a single device or plural devices operating in collaboration with each other. Stated otherwise, a plurality of processing sequences included in a single step may be executed as the processing sequences of a plurality of steps. Conversely, processing sequences described as a plurality of steps may be executed together as a single step.

The processing sequences of steps that describe the programs executed by the computer may be executed in a chronological order according to the sequences described in the present specification or may be executed concurrently or individually at necessary timings such as when called up. In other words, the processing sequences of steps may be executed in sequences different from the sequences describe above unless they cause anything incompatible. Moreover, the processing sequences of steps that describe the programs may be executed in parallel to the processing sequences of other programs, or may be executed in combination with the processing sequences of other programs.

Incidentally, plural present technologies described in the present specification may be carried out individually independently of each other unless they cause anything incompatible. Needless to say, plural desired ones of the present technologies may be carried out in combination. For example, some or all of the present technology described according to any one embodiment may be carried out in combination with some or all of the present technology described according to another embodiment. Furthermore, some or all of a desired one of the present technologies described above may be carried out in combination with another technology not described above.

<Example of Combinations of Arrangements>

The present technology can also have arrangements described below.

(1)

An information processing apparatus including:

a file generating section that generates a file including spatial positional information indicating spatial positions of respective pieces of partial Point Cloud data that represent individual parts into which Point Cloud data is segmented when the Point Cloud data is encoded on a three-dimensional structure base to generate encoded Point Cloud data streams, and grouping information that groups the partial Point Cloud data.

(2)

The information processing apparatus according to (1) above, in which the file generated by the file generating section further includes direction corresponding information indicating a direction required to display the partial Point Cloud on the basis of a local coordinate system of the Point Cloud data.

(3)

The information processing apparatus according to (2) above, in which the file generated by the file generating section further includes the spatial positional information that is changed dynamically.

(4)

The information processing apparatus according to (2) above, in which the file generated by the file generating section further includes the direction corresponding information that is changed dynamically.

(5)

The information processing apparatus according to (3) or (4) above, in which the file generated by the file generating section includes a file having a DASH MPD (Dynamic Adaptive Streaming over HTTP Media Presentation Description) or ISOBMFF (ISO Base Media File Format) structure.

(6)

The information processing apparatus according to any of (1) through (5) above, in which the parts include a brick representing a collection of points that can independently be encoded and decoded in the Point Cloud data, and the file generated by the file generating section further includes information linking spatial positional information of the brick in units of data of the brick in the Point Cloud data streams.

(7)

The information processing apparatus according to any of (1) through (6) above, in which the partial Point Cloud data includes a brick representing a collection of points that can independently be encoded and decoded in the Point Cloud data, and the file generated by the file generating section further includes information linking spatial positional information of the brick in units of data of the brick in streams of the partial Point Cloud data.

(8)

The information processing apparatus according to any of (1) through (7) above, in which the partial Point Cloud data includes a brick representing a collection of points that can independently be encoded and decoded in the Point Cloud data, and the file generated by the file generating section further includes information linking spatial positional information of the brick in units of data of the brick in streams of the partial Point Cloud data.

(9)

An information processing method including:

by an information processing apparatus, generating a file including spatial positional information indicating spatial positions of respective pieces of partial Point Cloud data that represent individual parts into which Point Cloud data is segmented when the information processing apparatus encodes the Point Cloud data on a three-dimensional structure base to generate encoded data streams, and grouping information that groups the partial Point Cloud data.

(10)

An information processing apparatus including:

an encoding section that generates partial definition degree information representing definition degrees of encoded parts when Point Cloud data is encoded on a three-dimensional structure base to generate encoded Point Cloud data streams, in which the encoding section generates directional information indicating a direction pointing to an area of a relatively high image quality in a local coordinate system of the Point Cloud data, on the basis of the partial definition degree information.

(11)

The information processing apparatus according to (10) above, further including:

a file generating section that generates a file including the partial definition degree information and the directional information generated by the encoding section.

(12)

The information processing apparatus according to (11) above, in which the file generated by the file generating section includes a file having a DASH MPD or ISOBMFF structure.

(13)

The information processing apparatus according to (12) above, in which the file generated by the file generating section further includes linking information of partial Point Cloud data pieces that are made high in definition in combination, with regard to partial Point Cloud data pieces representing individual parts into which the Point Cloud data is segmented.

(14)

The information processing apparatus according to (13) above, in which the file generated by the file generating section further includes definition degree information representing definition degrees of the partial Point Cloud data pieces in combination.

(15)

The information processing apparatus according to any of (11) through (14) above, in which the file generated by the file generating section further includes rendering information for rendering low-definition ones of the parts.

(16)

The information processing apparatus according to (15) above, in which the file generated by the file generating section further includes subjective quality increasing rendering information indicating a rendering process required to increase different subjective qualities of the respective parts.

(17)

An information processing method including:

by an information processing apparatus, generating partial definition degree information representing definition degrees of encoded parts when the information processing apparatus encodes Point Cloud data on a three-dimensional structure base to generate encoded data streams, in which directional information indicating a direction pointing to an area of a relatively high image quality is generated in a local coordinate system of the Point Cloud data on the basis of the partial definition degree information.

Incidentally, the present technology is not limited to the embodiment described above, and various changes and modifications may be made therein without departing from the scope of the present disclosure. The advantages described in the present specification are illustrative only, and not restrictive, and there may be other advantages.

REFERENCE SIGNS LIST

11: Data generating device
12: Data reproducing device
21: Controller
22: Memory
23: File generating section
31: Data inputting section
32: Data encoding and generating section
33: MPD file generating section
34: Recording section
35: Outputting section
36: Pre-processing section
37: Encoding section
38: File generating section
41: Controller
42: Memory
43: Reproduction processing section
51: Acquiring section
52: Display controlling section
53: Data analyzing and decoding section
54: Displaying section
55: File analyzing section
56: Decoding section
57: Display information generating section

The invention claimed is:

1. An information processing apparatus comprising:
 a file generating section that generates configured to generate a file including
  spatial positional information indicating spatial positions of respective pieces of partial Point Cloud data that represent individual parts into which Point Cloud data is segmented when the Point Cloud data is encoded on a three-dimensional structure base to generate encoded Point Cloud data streams, and
  grouping information that groups the partial Point Cloud data,
 wherein the partial Point Cloud data includes a tile representing a collection of points that can independently be encoded and decoded in the Point Cloud data,
 wherein the file generating section is implemented via at least one processor.

2. The information processing apparatus according to claim 1,
 wherein the file generated by the file generating section further includes the spatial positional information that is changed dynamically.

3. The information processing apparatus according to claim 2,
 wherein the file generated by the file generating section includes a file having a DASH MPD (Dynamic Adaptive Streaming over HTTP Media Presentation Description) or ISOBMFF (ISO Base Media File Format) structure.

4. The information processing apparatus according to claim 1,
 wherein the file generated by the file generating section further includes information linking spatial positional information of the tile in units of data of the tile in streams of the partial Point Cloud data.

5. An information processing method comprising:
 by an information processing apparatus,
 generating a file including
  spatial positional information indicating spatial positions of respective pieces of partial Point Cloud data that represent individual parts into which Point Cloud data is segmented when the information processing apparatus encodes the Point Cloud data on a three-dimensional structure base to generate encoded data streams, and
  grouping information that groups the partial Point Cloud data,
 wherein the partial Point Cloud data includes a tile representing a collection of points that can independently be encoded and decoded in the Point Cloud data.

6. An information processing method comprising:
 by an information processing apparatus,
 generating partial definition degree information representing definition degrees of encoded parts when the information processing apparatus encodes partial Point Cloud data on a three-dimensional structure base to generate encoded data streams,
 wherein directional information indicating a direction pointing to an area of a relatively high image quality is generated in a local coordinate system of the Point Cloud data, on a basis of the partial definition degree information, and
 wherein the partial Point Cloud data includes a tile representing a collection of points that can independently be encoded and decoded in the Point Cloud data.

7. A reproduction apparatus comprising:
 a decoding section configured to decode a file including
  spatial positional information indicating spatial positions of respective pieces of partial Point Cloud data that represent individual parts into which Point Cloud data is segmented when the Point Cloud data is encoded on a three-dimensional structure base to generate encoded Point Cloud data streams, and
  grouping information that groups the partial Point Cloud data,
 wherein the partial Point Cloud data includes a tile representing a collection of points that can independently be encoded and decoded in the Point Cloud data,
 wherein the decoding section is implemented via at least one processor.

8. The reproduction apparatus according to claim 7,
 wherein the file to be decoded by the decoding section further includes the spatial positional information that is changed dynamically.

9. The reproduction apparatus according to claim 8,
 wherein the file to be decoded by the decoding section includes a file having a DASH MPD (Dynamic Adaptive Streaming over HTTP Media Presentation Description) or ISOBMFF (ISO Base Media File Format) structure.

10. The reproduction apparatus according to claim 7,
 wherein the file to be decoded by the decoding section further includes information linking spatial positional information of the tile in units of data of the tile in streams of the partial Point Cloud data.

\* \* \* \* \*